(12) United States Patent
Kakugawa et al.

(10) Patent No.: US 6,909,348 B2
(45) Date of Patent: Jun. 21, 2005

(54) LOW-LEAKAGE MAGNETIC-FIELD MAGNET AND SHIELD COIL ASSEMBLY

(75) Inventors: Shigeru Kakugawa, Hitachi (JP);
Katsunori Azuma, Hitachi (JP);
Tsuyoshi Wakuda, Hitachi (JP);
Yoshihide Wadayama, Hitachiota (JP);
Hirotaka Takeshima, Ryugasaki (JP);
Kenji Sakakibara, Kashiwa (JP);
Takeshi Yatsuo, Kashiwa (JP); Takao Honmei, Hitachinaka (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 156 days.

(21) Appl. No.: 10/433,428

(22) PCT Filed: Dec. 4, 2001

(86) PCT No.: PCT/JP01/10579

§ 371 (c)(1),
(2), (4) Date: Jun. 4, 2003

(87) PCT Pub. No.: WO02/49513

PCT Pub. Date: Jun. 27, 2002

(65) Prior Publication Data

US 2004/0041673 A1 Mar. 4, 2004

(30) Foreign Application Priority Data

Dec. 5, 2000 (JP) ........................................ 2000-374694

(51) Int. Cl.$^7$ ................................................ H01F 7/00
(52) U.S. Cl. ....................................................... 335/301
(58) Field of Search .................................. 335/297–306, 335/216, 220; 324/318–322; 505/85, 103, 164, 211, 879–892

(56) References Cited

U.S. PATENT DOCUMENTS

| 5,883,558 A | 3/1999 | Laskaris et al. ......... 335/301 X |
| 5,900,794 A | 5/1999 | Palkovich et al. .......... 335/299 |

FOREIGN PATENT DOCUMENTS

| DE | 19645813 | 6/1997 |
| GB | 2307046 | 5/1997 |
| JP | 01-191405 | 8/1989 |
| JP | 06-034731 | 2/1994 |
| JP | 09-153408 | 6/1997 |
| JP | 9-182733 | 7/1999 |
| WO | 99/27851 | 6/1999 |

OTHER PUBLICATIONS

Kakugawa, S. et al, "A Study of Optimal Coil Configurations in a Split–Type Superconducting MRI Magnet", IEEE Transactions on Applied Superconductivity, vol. 9, No. 2, Jun. 1999, pp. 366–369.

*Primary Examiner*—James R. Scott
(74) *Attorney, Agent, or Firm*—Mattingly, Stanger & Malur, P.C.

(57) ABSTRACT

A magnet device provided with a shield current carrying means in which two sets of magneto-static field generating sources for generating magnetic fields directed towards a first direction are disposed facing each other across a finite region and at least one set of the magneto-static field generating sources are disclosed on at least two almost concentric circles. A first plane includes a first axis, a second axis and a first point. The first point is a point of insertion between the first axis parallel to the first direction and passing almost through the center of the shield current carrying means. The second axis crosses at right angles to the first axis and is spaced almost equal distance from the two sets of the generating sources. The alternately arranged positive and negative current carrying directions of the shield current carrying means are set in the order of increasing value of θn.

46 Claims, 27 Drawing Sheets

LOW-LEAKAGE MAGNETIC-FIELD MAGNET AND SHIELD COIL ASSEMBLY

FIELD OF THE INVENTION

The present invention relates to a magnet and leakage magnetic field shield assembly suitable for a nuclear magnetic resonance imaging (MRI) apparatus and more particularly, to a magnet device and leakage magnet field shield assembly which have a wide opening to provide a sense of openness for the test subject, a highly uniform magnetic field, and a low leakage magnetic field.

BACKGROUND OF THE INVENTION

In the field of the nuclear magnetic resonance imaging (MRI) apparatuses, those of the so-called open-type concept has being developed in recent years. These apparatuses can generally fall into the two types of the apparatuses: apparatuses using conventional cylindrical solenoid magnets with elongated axes for increasing the sense of openness, and apparatuses using open-type magnets for generating a uniform magnetic field between two opposite magnet assemblies to enable the access to the patient being imaged. The MRI apparatuses with the former magnets provide a greater sense of openness than the conventional apparatuses but the sense is still insufficient to meet the demand in the medical field.

The MRI apparatuses with the latter magnets can provide a remarkable sense of openness, which can make possible the so-called IVR (Interventional Radiology). International Laid-open Publication WO99/27851 "MAGNET APPARATUS AND MRI APPARATUS" discloses superconducting magnets suitable for such open-type MRI apparatuses.

The superconducting magnets consist of two magnet assemblies opposed across an MRI imaging area. Each magnet assembly has more than one superconducting magnets and is almost symmetric with respect to the z-axis. Main coils have alternately positive and negative pole coils and can generate a highly uniform magnetic field although they are compact.

The open-type magnets have, however, essentially lower efficiency of the magnetic field generation than conventional solenoid magnets and need a larger magnetomotive force of the magnets which may result in a high leakage magnetic field, as described in S. Kakugawa et al., "A Study on Optimal Coil Configurations in a Split-Type Superconducting MRI Magnet," IEEE Trans. Appl. Supercond., Vol. 9, No. 2, pp. 366–369, 1999.

One of solutions to the above problem is the use of shield coils as described in the above patent, reference, and U.S. Pat. No. 5,883,558, entitled "OPEN SUPERCONDUCTIVE MAGNET HAVING SHIELDING." Conventional solenoid magnets generally use the shield coils as lightweight and effective solutions.

Furthermore, as a method for shielding the leakage magnetic field, Japanese Laid-open patent Publication No. Hei 07-336023, entitled "SUPERCONDUCTING MAGNET DEVICE" discloses a superconducting magnet device consisting of a main coil for making a current in a constant direction flow, and a bucking coil for making a current in the reverse direction to the main coil flow, and correction coils for correcting the uniform degree of the magnetic field.

As described in the above patent and patent application, the shield coils can decrease the leakage magnetic field in the open-type magnets. However, more leakage magnetic fields may remain in the open-type magnets with the shield coils than in the conventional solenoid magnets with the shield coils, which may adversely affect the MRI apparatus installation in the hospital. More leakage magnetic fields may remain because the coils or permanent magnets for static magnetic fields may have a larger magnetomotive force, as described in the above reference, resulting in the larger magnetomotive force of the shield coils which may cause larger leakage magnetic field from the shield coil itself.

Therefore it is an object of the present invention to provide a magnet and shield coil assembly with a low leakage magnetic field.

DISCLOSURE OF THE INVENTION

The present invention provides a magnet device comprising two magnetostatic field-generating sources opposed across a finite region for generating a magnetic field in a first direction in said finite region, at least one of said generating sources including at least two shield current carrying means in almost concentric relation, said magnet device defining: a first axis being parallel to said first direction and passing through the almost center of said shield current carrying means; a second axis intersecting at right angles with said first axis and being spaced at an almost equal distance from said two magnetostatic field-generating sources; a first point where said first axis and second axis intersect, a first plane including said first axis, second axis, and first point; and an angle θn for the n-th shield current carrying means, said angle θn being in said first plane between said first axis and a half line extending from said first point to the cross section geometric center of said n-th shield current carrying means, wherein said shield current carrying means in one or two of said magnetostatic field-generating sources have alternately positive and negative current carrying directions with increasing value of said θn.

The present invention provides a magnet device comprising two magnetostatic field-generating sources opposed across a finite region for generating a magnetic field in a first direction in said finite region, each of said generating sources including at least one of magnetic field generation current carrying means for generating said magnetic field, at least one of said generating sources including at least two shield current carrying means in almost concentric relation, said magnet device defining: a first axis being parallel to said first direction and passing through the almost center of said shield current carrying means; a second axis intersecting at right angles with said first axis and being spaced at an almost equal distance from said two magnetostatic field-generating sources; a first point where said first axis and second axis intersect, a first plane including said first axis, second axis, and first point; and an angle θn for the n-th shield current carrying means, said angle θn being in said first plane between said first axis and a half line extending from said first point to the cross section geometric center of said n-th shield current carrying means, wherein said shield current carrying means in one or two of said magnetostatic field-generating sources have alternately positive and negative current carrying directions with increasing value of said θn.

The present invention provides a magnet device comprising two magnetostatic field-generating sources opposed across a finite region for generating a magnetic field in a first direction in said finite region, each of said generating sources including at least one of magnetic field generation current carrying means for generating said magnetic field, a ferromagnet for making the magnetic field uniform in said finite area, and at least one of correction current carrying means for making the magnetic field uniform, at least one of said generating sources including at least two shield current carrying means in almost concentric relation, said magnet device defining: a first axis being parallel to said first direction and passing through the almost center of said shield current carrying means; a second axis intersecting at right angles with said first axis and being spaced at an almost equal distance from said two magnetostatic field-generating sources; a first point where said first axis and second axis intersect; a first plane including said first axis, second axis, and first point; and an angle θn for the n-th shield current carrying means, said angle θn being in said first plane between said first axis and a half line extending from said first point to the cross section geometric center of said n-th shield current carrying means, wherein said shield current carrying means in one or two of said magnetostatic field-generating sources have alternately positive and negative current carrying directions with increasing value of said θn.

The present invention provides a magnet device comprising two magnetostatic field-generating sources opposed across a finite region for generating a magnetic field in a first direction in said finite region, each of said generating sources including a permanent magnet, at least one of said generating sources including at least two shield current carrying means in almost concentric relation, said magnet device defining: a first axis being parallel to said first direction and passing through the almost center of said shield current carrying means; a second axis intersecting at right angles with said first axis and being spaced at an almost equal distance from said two magnetostatic field-generating sources; a first point where said first axis and second axis intersect, a first plane including said first axis, second axis, and first point; and an angle θn for the n-th shield current carrying means, said angle θn being in said first plane between said first axis and a half line extending from said first point to the cross section geometric center of said n-th shield current carrying means, wherein said shield current carrying means in one or two of said magnetostatic field-generating sources have alternately positive and negative current carrying directions with increasing value of said θn.

The present invention provides a magnet device comprising two magnetostatic field-generating sources opposed across a finite region for generating a magnetic field in a first direction in said finite region, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction and being in almost concentric relation, said magnet device defining: a first axis being parallel to said first direction and passing through the almost center of said shield current carrying means; a second axis intersecting at right angles with said first axis and being spaced at an almost equal distance from said two magnetostatic field-generating sources; a first point where said first axis and second axis intersect; a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein said groups of said shield current carrying means in one or two of said magnetostatic field-generating sources have alternately positive and negative current carrying directions with increasing value of said θn.

The present invention provides a magnet device comprising two magnetostatic field-generating sources opposed across a finite region for generating a magnetic field in a first direction in said finite region, each of said generating sources including at least one of magnetic field generation current carrying means for generating said magnetic field, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction and being in almost concentric relation, said magnet device defining: a first axis being parallel to said first direction and passing through the almost center of said shield current carrying means; a second axis intersecting at right angles with said first axis and being spaced at an almost equal distance from said two magnetostatic field-generating sources; a first point where said first axis and second axis intersect; a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein said groups of said shield current carrying means in one or two of said magnetostatic field-generating sources have alternately positive and negative current carrying directions with increasing value of said θn.

The present invention provides a magnet device comprising two magnetostatic field-generating sources opposed across a finite region for generating a magnetic field in a first direction in said finite region, each of said generating sources including at least one of magnetic field generation current carrying means for generating said magnetic field and a ferromagnet for making the magnetic field uniform in said finite area, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction and being in almost concentric relation, said magnet device defining: a first axis being parallel to said first direction and passing through the almost center of said shield current carrying means; a second axis intersecting at right angles with said first axis and being spaced at an almost equal distance from said two magnetostatic field-generating sources; a first point where said first axis and second axis intersect; a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein said groups of said shield current carrying means in one or two of said magnetostatic field-generating sources have alternately positive and negative current carrying directions with increasing value of said θn.

The present invention provides a magnet device comprising two magnetostatic field-generating sources opposed across a finite region for generating a magnetic field in a first direction in said finite region, each of said generating sources including at least one of magnetic field generation current carrying means for generating said magnetic field, a ferromagnet for making the magnetic field uniform in said finite area, and at least one of correction current carrying means for making the magnetic field uniform, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction and being in almost concentric relation, said magnet device defining: a first axis being parallel to said first direction and passing through the almost center of said shield current carrying means; a second axis intersecting at right angles with said first axis and being spaced at an almost equal distance from said two magnetostatic field-generating sources; a first point where said first axis and second axis intersect; a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein said groups of said shield current carrying means in one or two of said magnetostatic field-generating sources have alternately positive and negative current carrying directions with increasing value of said θn.

The present invention provides a magnet device comprising two magnetostatic field-generating sources opposed across a finite region for generating a magnetic field in a first direction in said finite region, each of said generating sources including a permanent magnet, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction being in almost concentric relation, said magnet device defining: a first axis being parallel to said first direction and passing through the almost center of said shield current carrying means; a second axis intersecting at right angles with said first axis and being spaced at an almost equal distance from said two magnetostatic field-generating sources; a first point where said first axis and second axis intersect; a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein said groups of said shield current carrying means in one or two of said magnetostatic field-generating sources have alternately positive and negative current carrying directions with increasing value of said θn.

The present invention provides a magnet device and shield current carrying means assembly comprising: a magnet device for generating a magnetic field in a first direction in a finite region; and at least two shield current carrying means almost concentric with a first axis being almost parallel to said first direction and passing through the almost center of said magnet device, said magnet device and shield current carrying means assembly defining: a first point on said first axis at said almost center of said magnet device; a first plane including said first axis and first point; a second plane including said first point and intersecting at almost right angles with said first axis; and an angle θn for the n-th shield current carrying means, said angle θn being in said first plane between said first axis and a half line extending from said first point to the cross section geometric center of said n-th shield current carrying means, wherein said shield current carrying means in at least one of the two spaces separated by said second plane has alternately positive and negative current carrying directions with increasing value of said θn.

The present invention provides a magnet device and shield current carrying means group assembly comprising: a magnet device for generating a magnetic field in a first direction in a finite region; and at least two groups of shield current carrying means almost concentric with a first axis being almost parallel to said first direction and passing through the almost center of said magnet device, each group consisting of at least one shield current carrying means, at least one group of said shield current carrying means including at least two shield current carrying means, said shield current carrying means making up each group of said shield current carrying means having the same shield current carrying direction, said assembly including: a first point on said first axis at said almost center of said magnet device; a first plane including said first axis; a second plane including said first point and intersecting at almost right angles with said first axis; and an angle θn for the n-th group of said shield current carrying means, said angle θn being in said first plane between said first axis and a half line extending from said first point to the cross section geometric center of all the shield current carrying means making up said n-th group of said shield current carrying means, wherein said groups of said shield current carrying means in at least one of the two spaces separated by said second plane has alternately positive and negative current carrying directions with increasing value of said θn.

The present invention provides a shield current carrying means group assembly for controlling or reducing the magnetic field leakage of a magnet device for generating a magnetic field in a first direction in a finite region, comprising at least two groups of shield current carrying means almost concentric with a first axis being almost parallel to said first direction and passing through the almost center of said magnet device, each group consisting of at least one shield current carrying means, at least one group of said shield current carrying means including at least two shield current carrying means, said shield current carrying means making up each group of said shield current carrying means having the same shield current carrying direction, said assembly including: a first point on said first axis at said almost center of said magnet device; a first plane including said first axis and first point; a second plane including said first point and intersecting at almost right angles with said first axis; and an angle θn for the n-th group of said shield current carrying means, said angle θn being in said first plane between said first axis and a half line extending from said first point to the cross section geometric center of all the shield current carrying means making up said n-th group of said shield current carrying means, wherein said groups of said shield current carrying means in at least one of the two spaces separated by said second plane has alternately positive and negative current carrying directions with increasing value of said θn.

The present invention provides a magnet device comprising one or more magnetostatic field-generating sources almost concentric with a center axis, said magnet device defining: a sphere centered at the center of said one or more magnetostatic field-generating sources and circumscribed about said magnet device; and a semicircle centered at said center with both ends of said semicircle on said center axis and with a radius from 1.1 to 2.0 times the radius of said sphere, wherein a magnetic field vector on said semicircle has a radial component having alternately opposite directions along the arc from one end to another of said semicircle and having more than five adjacent regions with different direction, and/or a tangential component having alternately opposite directions along the arc from one end to another of said semicircle and having more than four adjacent regions with different directions.

The principle and operation of the solution described above will be described below. The magnetic field can fall into two fields: a magnetic field in the internal area 234 of a sphere inscribed in the magnetic field-generating source, for example, a current 236 such as a coil or a magnetic material, and a magnetic field in the external area 235 of a sphere circumscribed about the magnetic field-generating source, as shown in FIG. 17. If the field point P is in either the internal area 234 or the external area 235, the magnetic field at the point P satisfies the Laplace equation (1), $$\Delta \vec{B} = 0 \qquad \text{(equation 1)}$$

The general solution of the equation (1) in the internal area 234 is the well-known spherical harmonics as given in the equation (2), $$B_z = \sum_{n=0}^{\infty} D_n r^n P_n(\cos\theta) \qquad \text{(equation 2)}$$

The general solution of the equation (1) in the external area 235 is the spherical surface harmonics including an inverse power of r to be holomorphic at infinity as given in the equation (3), $$B_z = \sum_{n=1}^{\infty} H_n \frac{1}{r^{n+2}} P_{n+1}(\cos\theta) \qquad \text{(equation 3)}$$

$$B_\rho = -\sum_{n=1}^{\infty} H_n \frac{1}{(n+1)r^{n+2}} P_{n+1}^1(\cos\theta)$$

Where $P_n$ and $P_n^m$ are the Legendre function and associated Legendre function, respectively, r and θ are the polar coordinates of the field point P, and $D_n$ and $H_n$ are expansion coefficients in the internal and external areas, respectively. The equation (3) shows that higher order in the magnetic field in the external area 235, i.e., the leakage magnetic field, will decrease more rapidly. If the magnets are symmetric with respect to the central plane at z=0, the magnetic fields of even order vanish due to the symmetry.

FIGS. 18 to 21 show the magnetic field distributions for order n=1, 3, 5, 7. The magnetic fields of the first, third, fifth, and seventh order decrease in inverse proportion to the third, fifth, seventh, and ninth power of r from the origin. Thus, the sequential elimination from the lower order magnetic field can decrease rapidly the leakage magnetic field. The magnetic field strength of each order can be adjusted to control the leakage magnetic field distribution. The first order component of the leakage magnetic field is proportional to the magnetic moment of the magnet.

The leakage magnetic field expanded in the spherical surface harmonics will have components that need to be controlled with more than one shield coil, of which the arrangement can be calculated by the equation (3). The embodiments of the present invention will disclose the calculation examples on the shield coils. FIGS. 18, 19, 20, and 21 show the characteristics requirements for the shield coils. It is supposed here that the magnets are symmetric with respect to the central plane at z=0. The discussion below will demonstrate, however, that the shield coils will require the same characteristics even if the magnets are not symmetric. In figures below, there are general symbols near the coils for representing the coils' electric current directions.

To suppress or control the first order component of the leakage magnetic field 238 shown in FIG. 18, a pair of shield coils, in others word, one shield coil for each of the two magnetostatic field-generating sources may be provided. The references described above disclose such a shield coil arrangement. As mentioned above, however, a pair of shield coils cannot decrease sufficiently the leakage magnetic field for the open-type magnets in which the two magnetostatic field-generating sources are opposed across a uniform magnetic field area.

It is because, as shown in FIG. 22, the arrangement of the magnetostatic field-generating sources such as main coils 242, 243 and, a pair of shield coils 244, 245 almost corresponds to the magnetic field generation arrangement which may increase the third order component of the leakage magnetic field 239. Such a shield coil arrangement disclosed in the references described above may cause the shield coils themselves to significantly increase the third order component of the leakage magnetic field 239 so that the leakage magnetic field cannot decrease sufficiently. Thus, more shield coils are needed to decrease the third order component of the leakage magnetic field 239.

FIG. 23 shows an arrangement of two pairs of the shield coils. The arrangement of the main coils 246, 247 for the magnetostatic field-generating sources and the shield coils 248, 249, 250, and 251 almost corresponds to the magnetic field generation which may produce the fifth order component of the leakage magnetic field 240. As the coil arrangement in FIG. 23 is symmetric with respect to the central plane at z=0, the area of the z>0 will only be discussed below.

In FIG. 23, the shield coils are arranged as follows: if half lines 254, 256 are defined as lines extending from the origin 253 to the cross section geometric center of each of the shield coils 248 and 250, respectively, and θ1, θ2 are defined as angles 255, 257 between the z-axis 252 and the half lines 254, 256, respectively, then the shield coil 248 corresponding to the θ1 has a positive current direction (the same direction as that of the main coils), and the shield coil 250 corresponding to the θ2 has a negative current direction (the opposite direction to that of the main coils). This can be generalized in that if the θn is defined as the angle for the n-th shield coil, the shield coils will have alternately positive and negative current directions with increasing value of the θn. Thus, to control the fifth order component of the leakage magnetic field, the shield coils with the positive current direction (the same direction as that of the main coils) are necessary.

FIG. 24 shows three pairs of the shield coils to control the seventh order component of the leakage magnetic field. The arrangement of the main coils 258, 259 for the magnetostatic field-generating sources and the three pairs of the shield coils 260, 261, 262, 263, 264, and 265 almost corresponds to the magnetic field generation which may produce the seventh order component of the leakage magnetic field 241. As the coil arrangement in FIG. 24 is also symmetric with respect to the central plane at z=0, the area of the z>0 will only be discussed below.

In FIG. 24, the shield coils are arranged as follows: if half lines 268, 270, and 272 are defined as lines extending from the origin 267 to the cross section geometric center of each of the shield coils 260, 262, and 264, respectively, and $\theta 1$, $\theta 2$, and $\theta 3$ are defined as angles 269, 271, and 273 between the z-axis 266 and the half lines 268, 270, and 272, respectively, then the shield coil 260 corresponding to the $\theta 1$ will have a negative current direction (the opposite direction to that of the main coils), the shield coil 262 corresponding to the $\theta 2$ will have a positive current direction (the same direction as that of the main coils), and the shield coil 264 corresponding to the $\theta 3$ will have a negative current direction (the opposite direction to that of the main coils). This can be generalized in that if the $\theta n$ is defined as the angle for the n-th shield coil, the shield coils will have alternately positive and negative current directions with increasing value of the $\theta n$.

As described above, to reduce the leakage magnetic field in the open-type magnet, the higher order components of the leakage magnetic fields need to be controlled. To do so, the shield coils with the negative current direction (the opposite direction to that of the main coils) and the shield coils with the positive current direction (the same direction as that of the main coils) are both necessary.

The arrangement of this more than one shield coil follows the magnetic field generation that corresponds to the space distribution of the higher components of the leakage magnetic field as shown in FIGS. 19 to 21. The arrangement can be generalized in that, if the following is defined: two magneto-static field-generating sources are opposed; each magneto-static field-generating source includes more than one shield coil in almost concentric relation; the center axis is the z-axis; $\theta$ is an angle between the z-axis and a half line extending from the origin to the cross section geometric and the n-th shield coil corresponds to the $\theta n$, then the shield coils in one or two of the two magneto-static field-generating sources have alternately positive and negative current directions with increasing value of the $\theta n$. The inventors have provided the shield coils arrangement disclosed in the present invention for the first time, by determining the general solution in spherical harmonics (equation (3)) for the Laplace equation for the magnetic field in the external area 235 in FIG. 17, and by figuring out the magnetic field generation arrangement which may provide the space distribution of the higher order components of the leakage magnetic field as shown in FIGS. 19 to 21.

The present invention can also be characterized by the leakage magnetic field distribution. First, discussion will be given to the leakage magnetic field distribution in the conventional active-shield type of the open-type MRI magnets shown in FIG. 22. A semicircle is given which is centered at the magnet center, i.e., the origin in FIG. 22 and has its both ends on the z-axis and has a radius from 1.1 to 1.5 times the radius of a semicircle circumscribed about the magnets (only the coils shown).

Such a radius range is selected as a range where the leakage magnetic field is practically measurable. The magnetic field vector on the semicircle can fall into radial and tangential components. As shown in FIG. 22, in the leakage magnetic field distribution in the conventional active-shield type of the open-type MRI magnets, the radial component on the semicircle has alternately opposite directions along the arc from one end to another of the semicircle and has four adjacent regions with different directions. The tangential component on the semicircle has alternately opposite directions along the arc from one end to another of the semicircle and has three adjacent regions with different directions.

In the leakage magnetic field distribution according to the embodiment of the present invention shown in FIG. 23, the radial component on the semicircle has alternately opposite directions along the arc from one end to another of the semicircle and has six adjacent regions with different directions. The tangential component on the semicircle has alternately opposite directions along the arc from one end to another of the semicircle and has five adjacent regions with different directions. In this way, the present invention uses the coil having a positive current direction unlike the conventional magnets shown in FIG. 22. Thus, the present invention almost eliminates the first order component of the leakage magnetic field which is dominant in the leakage magnetic field in the conventional magnets in FIG. 22 and makes the third order component of the leakage magnetic field dominant, thus providing a different number of adjacent regions with different directions of the magnetic components on the semicircle in the leakage magnetic field as described above.

FIG. 23 illustrates the magnets symmetric with respect to the central plane. However, the magnets generally may not be symmetric. Including such a case, the present invention can be generalized in terms of the leakage magnetic field distribution as follows. The radial component of the magnetic field on the semicircle as described above may have alternately opposite directions along the arc from one end to another of the semicircle and has more than five adjacent regions with different directions. Alternatively, the tangential component of the magnetic field on the semicircle as described above may have alternately opposite directions along the arc from one end to another of the semicircle and has more than four adjacent regions with different directions.

DESCRIPTION OF THE PREFERRED EMBODIMENTS

The embodiment of the present invention will be specifically described below referring to FIGS. 1 to 11. In figures below, there are general symbols near the coils for representing the coils' electric current directions.

Figure 1:
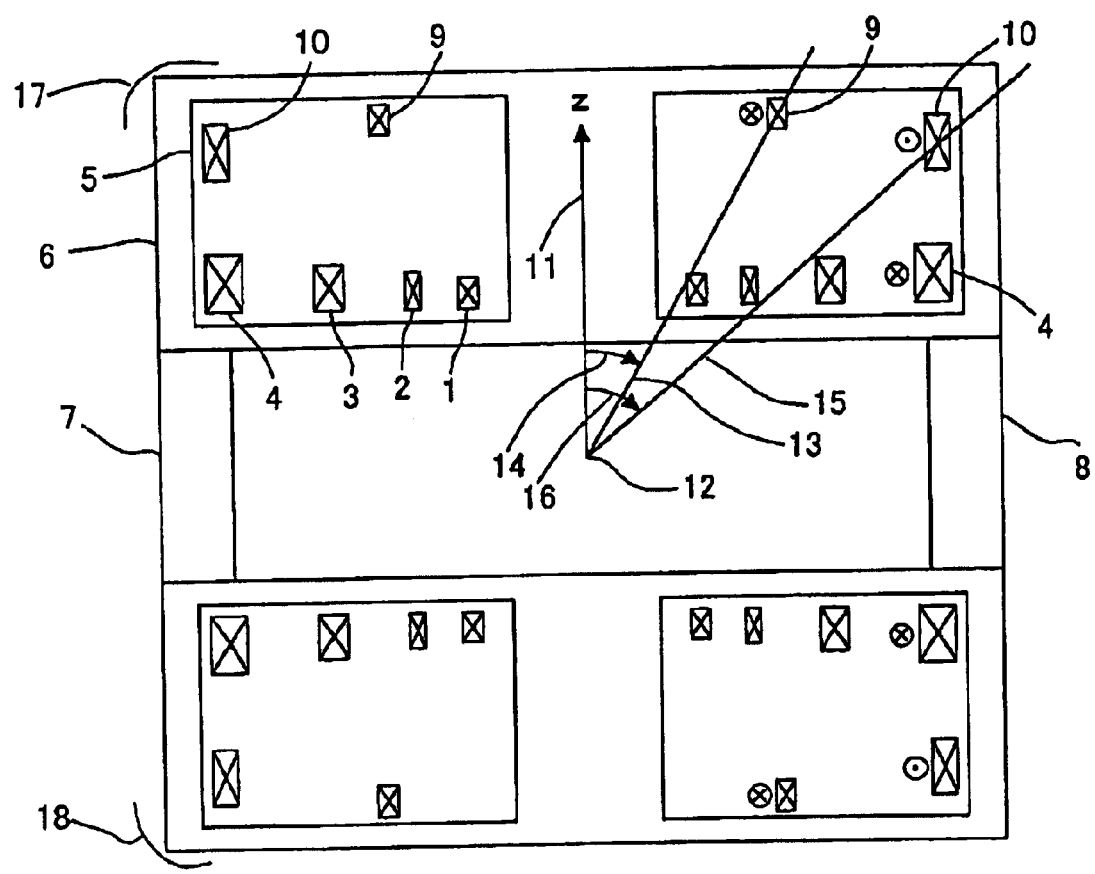
FIG. 1 shows a cross sectional view of superconducting magnets according to an embodiment of the present invention.

FIG. 1 shows a cross sectional view of superconducting magnets included in the open-type MRI apparatus.

The MRI apparatus in FIG. 1 includes a pair of upper and lower superconducting magnet assemblies 17 and 18, which may produce a uniform, magnetic field along the z-axis in the open region. The MRI imaging can be performed in the center part of the open region. The superconducting main coils 1, 2, 3, and 4 are contained in a low-temperature enclosure 5, which is in turn involved in a vacuum chamber 6. Although not shown in FIG. 1 for simplicity, the device also has a support structure for the superconducting coils and a heat shield between the vacuum chamber and low-temperature enclosure to prevent the penetration of heat radiation. The low-temperature enclosure contains liquid helium, which can cool the superconducting coils to a cryogenic temperature (4.2 K) to keep them in the superconducting state.

Connecting tubes 7, 8 between the upper and lower vacuum chambers can hold the chambers at a predetermined distance. These connecting tubes 7, 8 can mechanically support the upper and lower vacuum chambers. The tubes 7, 8 may also thermally connect the upper and lower low-temperature enclosures. This can replace the upper and lower cooling machines in the system with one cooling machine. The number of the connecting tubes 7, 8 does not need to be limited to two as shown in FIG. 1 and may be three or four or more, and may be one to support the vacuum chambers on one side to provide a greater sense of openness between the magnets.

The upper and lower magnet assemblies each include two superconducting shield coils for suppressing the leakage magnetic field. The upper magnet assembly 17 will be described below. The low-temperature enclosure 5 contains the superconducting shield coils 9, 10 and the liquid helium cools the coils to 4.2 K to keep them in the superconducting state. The superconducting main coils 1, 2, 3, 4, and the superconducting shield coils 9, 10 are almost concentric with respect to the center axis 11 denoted as the z-axis in FIG. 1.

The center axis (z-axis) 11 passes through the center 12 of the magnets. In the cross section of FIG. 1, i.e., the cross section including the center axis (z-axis) 11, θ1 is defined as an angle 14 between the center axis (z-axis) 11 and a half line 13 extending from the center 12 to the cross section geometric center of the superconducting shield coil 9, and θ2 as an angle 16 between the center axis (z-axis) 11 and a half line 15 extending from the center 12 to the cross section geometric center of the superconducting shield coil 10, and the θ1, θ2 are in a relation of θ1<θ2. If the superconducting main coil 4 is defined to have a positive current direction, then the superconducting shield coils 9 and 10 corresponding to θ1 and θ2, respectively, will have positive and negative current directions, respectively.

This can be generalized in that the superconducting shield coils will have alternately positive and negative current directions with increasing value of the θn. The superconducting shield coil 10 with the largest radius of the two superconducting shield coils may have a larger magnetomotive force in absolute value than the other. As described above, the superconducting shield coils in this embodiment can control the higher order components of the leakage magnetic field to provide the leakage magnetic field lower than that in the conventional magnets described above.

Another embodiment of the present invention will be described below.

Figure 2:
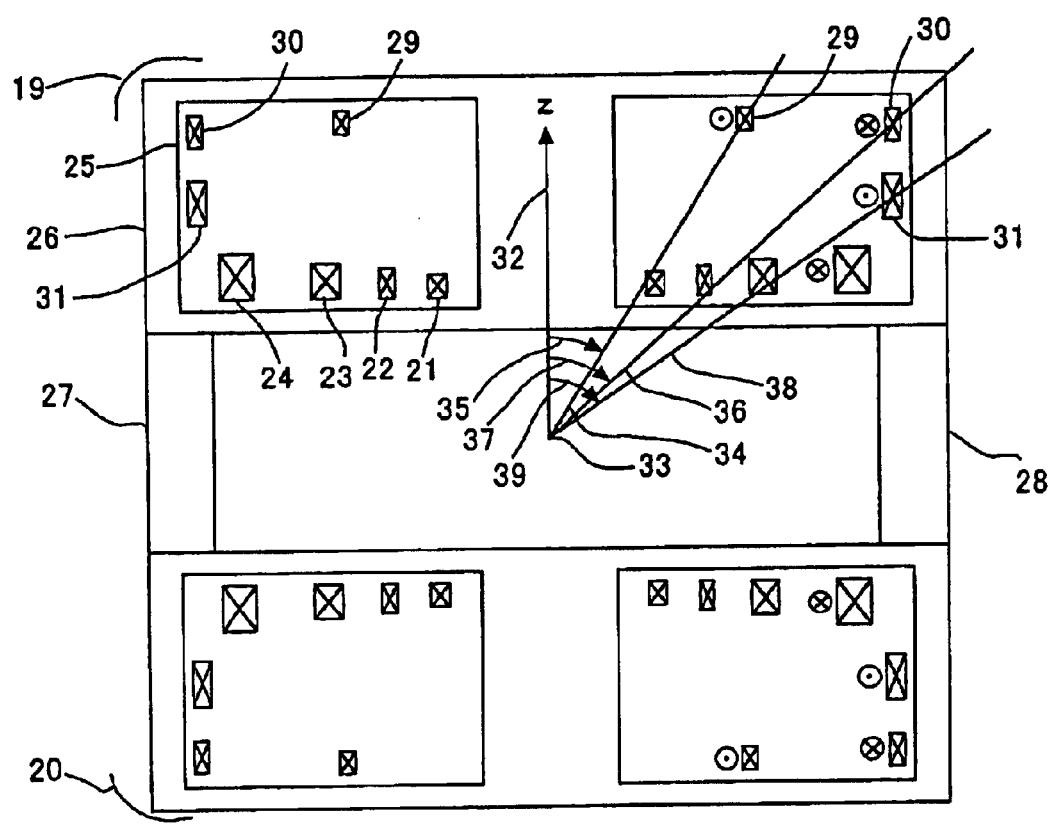
FIG. 2 shows a cross sectional view of superconducting magnets according to an embodiment of the present invention.

FIG. 2 shows a cross sectional view of the superconducting magnets in the open-type MRI apparatus according to another embodiment of the present invention. In this embodiment, the upper and lower magnet assemblies 19, 20 each include three superconducting shield coils. The superconducting main coils 21, 22, 23, and 24 are contained in a low-temperature enclosure 25, which is in turn involved in a vacuum chamber 26. Although not shown in FIG. 2 for simplicity, the device also has a support structure for the superconducting coils and a heat shield between the vacuum chamber and low-temperature enclosure to prevent the penetration of heat radiation. The low-temperature enclosure contains liquid helium, which can cool the superconducting coils to a cryogenic temperature (4.2 K) to keep them in the superconducting state.

Connecting tubes 27, 28 between the upper and lower vacuum chambers can hold the chambers at a predetermined distance.

These connecting tubes 27, 28 can mechanically support the upper and lower vacuum chambers. The tubes 27, 28 may also thermally connect the upper and lower low-temperature enclosures. This can replace the upper and lower cooling machines in the system with one cooling machine. The number of the connecting tubes 27, 28 does not need to be limited to two as shown in FIG. 2 and may be three or four or more, and may be one to support the vacuum chambers on one side to provide a greater sense of openness between the magnets.

The upper and lower magnet assemblies each include three superconducting shield coils for suppressing the leakage magnetic field. The upper magnet assembly 19 will be described below. The low-temperature enclosure 25 contains the superconducting shield coils 29, 30, and 31 and the liquid helium cools the coils to 4.2 K to keep them in the superconducting state. The main coils 21, 22, 23, 24, and the superconducting shield coils 29, 30, 31 are almost concentric with respect to the center axis 32 denoted as the z-axis in FIG. 2. The center axis (z-axis) 32 passes through the center 33 of the magnets.

In the cross section of FIG. 2, i.e., the cross section including the center axis (z-axis) 32, $\theta 1$, $\theta 2$, and $\theta 3$ are defined as angles 35, 37, and 39 between the center axis (z-axis) 32 and half lines 34, 36, and 38, respectively, the half lines 34, 36, and 38 extending from the center 33 to the cross section geometric center of each of the superconducting shield coils 29, 30, and 31, respectively, and the $\theta 1$, $\theta 2$, and $\theta 3$ are in a relation of $\theta 1 < \theta 2 < \theta 3$. If the superconducting main coil 24 is defined to have a positive current direction, then the superconducting shield coils 29, 30, and 31 corresponding to $\theta 1$, $\theta 2$, and $\theta 3$, respectively, will have negative, positive, and negative current directions, respectively.

This can be generalized in that the superconducting shield coils will have alternately positive and negative current directions with increasing value of the $\theta n$. The superconducting shield coil 31 with the largest radius of the three superconducting shield coils may have a larger magnetomotive force in absolute value than the others. As described above, the superconducting shield coils in this embodiment can control the higher order components of the leakage magnetic field to provide the leakage magnetic field lower than that in the conventional magnets described above.

Figure 3:
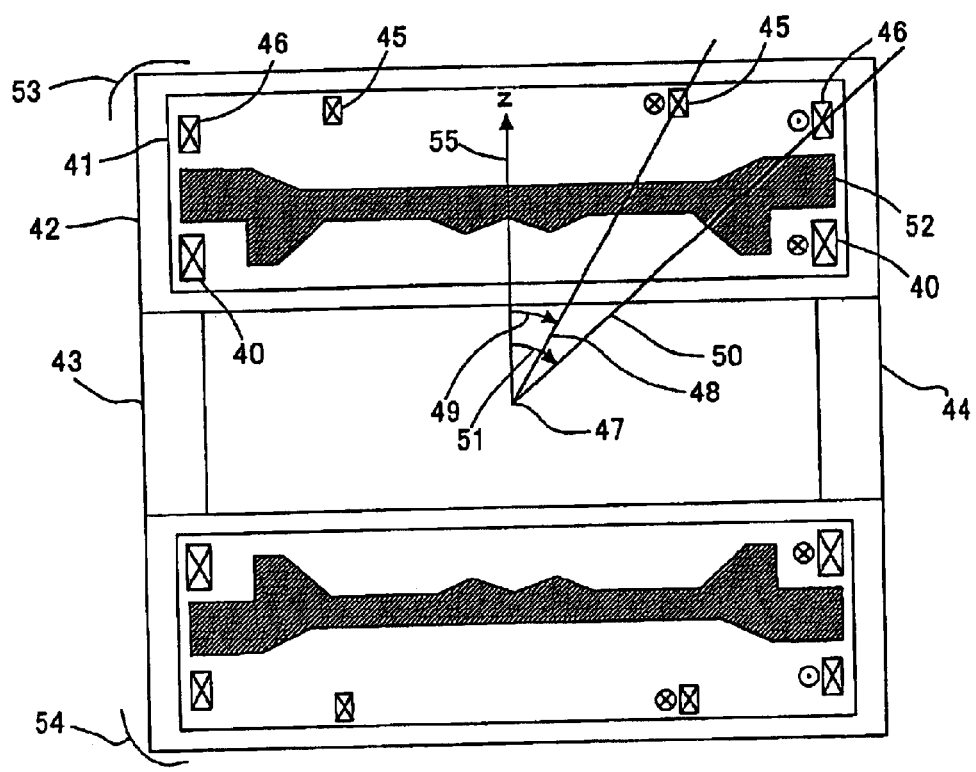
FIG. 3 shows a cross sectional view of superconducting magnets according to an embodiment of the present invention.

FIG. 3 shows a cross sectional view of the superconducting magnets in the open-type MRI apparatus according to another embodiment of the present invention. This embodiment uses one superconducting main coil 40 and a magnet pole 52 to produce a uniform magnetostatic field. The upper and lower magnet assemblies 53, 54 each include two superconducting shield coils. The superconducting main coil 40 and the magnet pole 52 are contained in a low-temperature enclosure 41, which is in turn involved in a vacuum chamber 42. Although not shown in FIG. 3 for simplicity, the device also has a support structure for the superconducting coils and magnet pole and has a heat shield between the vacuum chamber and low-temperature enclosure to prevent the penetration of heat radiation. The low-temperature enclosure contains liquid helium, which can cool the superconducting coils to a cryogenic temperature (4.2 K) to keep them in the superconducting state.

Connecting tubes 43, 44 between the upper and lower vacuum chambers can hold the chambers at a predetermined distance. These connecting tubes 43, 44 can mechanically support the upper and lower vacuum chambers. The tubes 43, 44 may also thermally connect the upper and lower low-temperature enclosures. This can replace the upper and lower cooling machines in the system with one cooling machine. The number of the connecting tubes 43, 44 does not need to be limited to two as shown in FIG. 3 and may be three or four or more, and may be one to support the vacuum chambers on one side to provide a greater sense of openness between the magnets.

The upper and lower magnet assemblies each include two superconducting shield coils for suppressing the leakage magnetic field. The upper magnet assembly 53 will be described below. The low-temperature enclosure 41 contains the superconducting shield coils 45, 46 and the liquid helium cools the coils to 4.2 K to keep them in the superconducting state. The main coil 40 and superconducting shield coils 45, 46 are almost concentric with respect to the center axis 55 denoted as the z-axis in FIG. 3.

The center axis (z-axis) 55 passes through the center 47 of the magnets. In the cross section of FIG. 3, i.e., the cross section including the center axis (z-axis) 55, $\theta 1$, $\theta 2$ are defined as angles 49, 51 between the center axis (z-axis) 55 and half lines 48, 50, respectively, the half lines 48, 50 extending from the center 55 to the cross section geometric center of each of the superconducting shield coils 45, 46, respectively, and the $\theta 1$, $\theta 2$ are in a relation of $\theta 1 < \theta 2$. If the superconducting main coil 40 is defined to have a positive current direction, then the superconducting shield coils 45 and 46 corresponding to $\theta 1$ and $\theta 2$, respectively, will have positive and negative current directions, respectively.

This can be generalized in that the superconducting shield coils will have alternately positive and negative current directions with increasing value of the $\theta n$. The superconducting shield coil 46 with the largest radius of the two superconducting shield coils may have a larger magnetomotive force in absolute value than the other. As described above, the superconducting shield coils in this embodiment can control the higher order components of the leakage magnetic field to provide the leakage magnetic field lower than that in the conventional magnets described above. This embodiment uses the magnet pole 52 to produce a uniform magnetostatic field so that the superconducting main coil 40 may have a smaller magnetomotive force in absolute value than the superconducting main coils in the embodiments shown in FIGS. 1 and 2. The superconducting shield coils 45, 46 may then also have a smaller magnetomotive force in absolute value than the superconducting shield coils in the embodiments in FIGS. 1 and 2. Thus, the each shield coil may have a smaller electromagnetic force.

Figure 4:
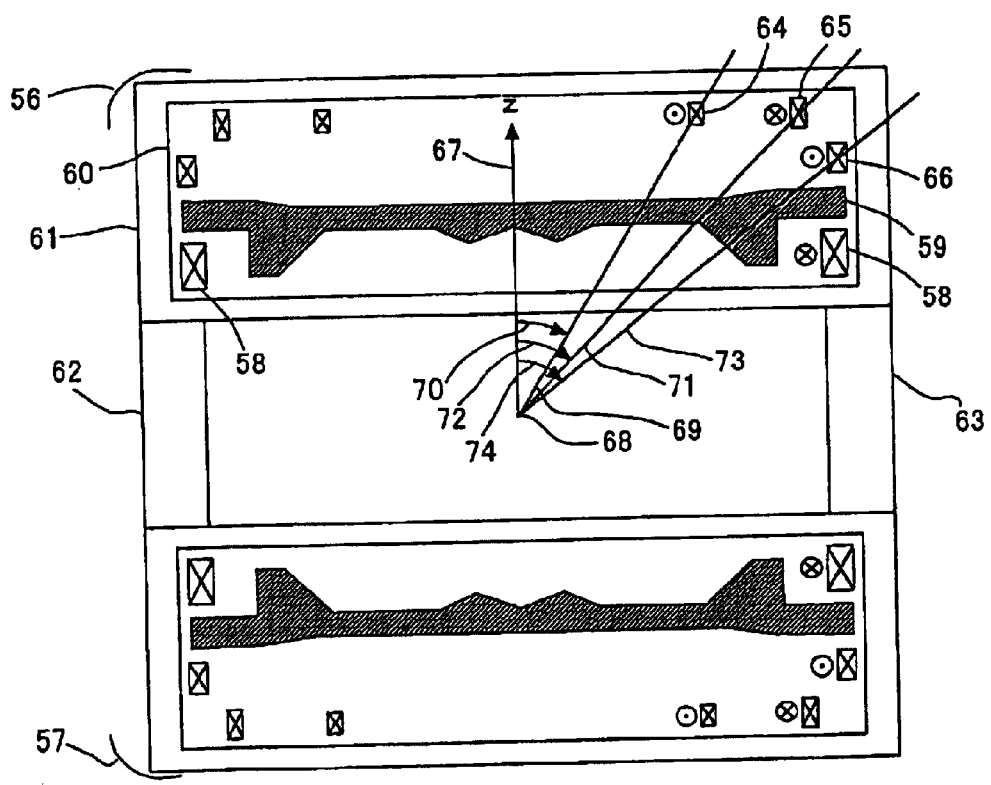
FIG. 4 shows a cross sectional view of superconducting magnets according to an embodiment of the present invention.

FIG. 4 shows a cross sectional view of the superconducting magnets in the open-type MRI apparatus according to another embodiment of the present invention. This embodiment uses one superconducting main coil 58 and a magnet pole 59 to produce a uniform magnetostatic field. The upper and lower magnet assemblies 56, 57 each include three superconducting shield coils. The superconducting main coil 58 and the magnet pole 59 are contained in a low-temperature enclosure 60, which is in turn involved in a vacuum chamber 61. Although not shown in FIG. 4 for simplicity, the device also has a support structure for the superconducting coils and magnet pole and has a heat shield between the vacuum chamber and low-temperature enclosure to prevent the penetration of heat radiation. The low-temperature enclosure contains liquid helium, which can cool the superconducting coils to a cryogenic temperature (4.2 K) to keep them in the superconducting state.

Connecting tubes 62, 63 between the upper and lower vacuum chambers can hold the chambers at a predetermined distance. These connecting tubes 62, 63 can mechanically support the upper and lower vacuum chambers. The tubes 62, 63 may also thermally connect the upper and lower low-temperature enclosures. This can replace the upper and lower cooling machines in the system with one cooling machine. The number of the connecting tubes 62, 63 does not need to be limited to two as shown in FIG. 4 and may be three or four or more, and may be one to support the vacuum chambers on one side to provide a greater sense of openness between the magnets.

The upper and lower magnet assemblies each include three superconducting shield coils for suppressing the leakage magnetic field. The upper magnet assembly 56 will be described below. The low-temperature enclosure 60 contains the superconducting shield coils 64, 65, and 66 and the liquid helium cools the coils to 4.2 K to keep them in the superconducting state. The superconducting main coil 58 and superconducting shield coils 64, 65, and 66 are almost concentric with respect to the center axis 67 denoted as the z-axis in FIG. 4.

The center axis (z-axis) 67 passes through the center 68 of the magnets. In the cross section of FIG. 4, i.e., the cross section including the center axis (z-axis) 67, θ1, θ2, and θ3 are defined as angles 70, 72, and 74 between the center axis (z-axis) 67 and half lines 69, 71, and 73, respectively, the half lines 69, 71, and 73 extending from the center 68 to the cross section geometric center of each of the superconducting shield coils 64, 65, and 66, respectively, and the θ1, θ2, and θ3 are in a relation of θ1<θ2<θ3. If the superconducting main coil 58 is defined to have a positive current direction, then the superconducting shield coils 64, 65, and 66 corresponding to θ1, θ2, and θ3, respectively, will have negative, positive, and negative current directions, respectively. This can be generalized in that the superconducting shield coils will have alternately positive and negative current directions with increasing value of the θn. The superconducting shield coil 66 with the largest radius of the three superconducting shield coils may have a larger magnetomotive force in absolute value than the others.

As described above, the superconducting shield coils in this embodiment can control the higher order components of the leakage magnetic field to provide the leakage magnetic field lower than that in the conventional magnets described above. In particular, this embodiment uses three pairs of the shield coils to control even higher order components of the leakage magnetic field to provide the lower leakage magnetic field than the embodiment disclosed in FIG. 3. This embodiment also uses the magnet pole 59 to produce a uniform magnetostatic field so that the superconducting main coil 58 may have a smaller magnetomotive force in absolute value than the superconducting main coils in the embodiments shown in FIGS. 1 and 2. The superconducting shield coils 64, 65, and 66 may then also have a smaller magnetomotive force in absolute value than the superconducting shield coils in the embodiments in FIGS. 1 and 2. Thus, the each shield coil may have a smaller electromagnetic force.

Figure 5:
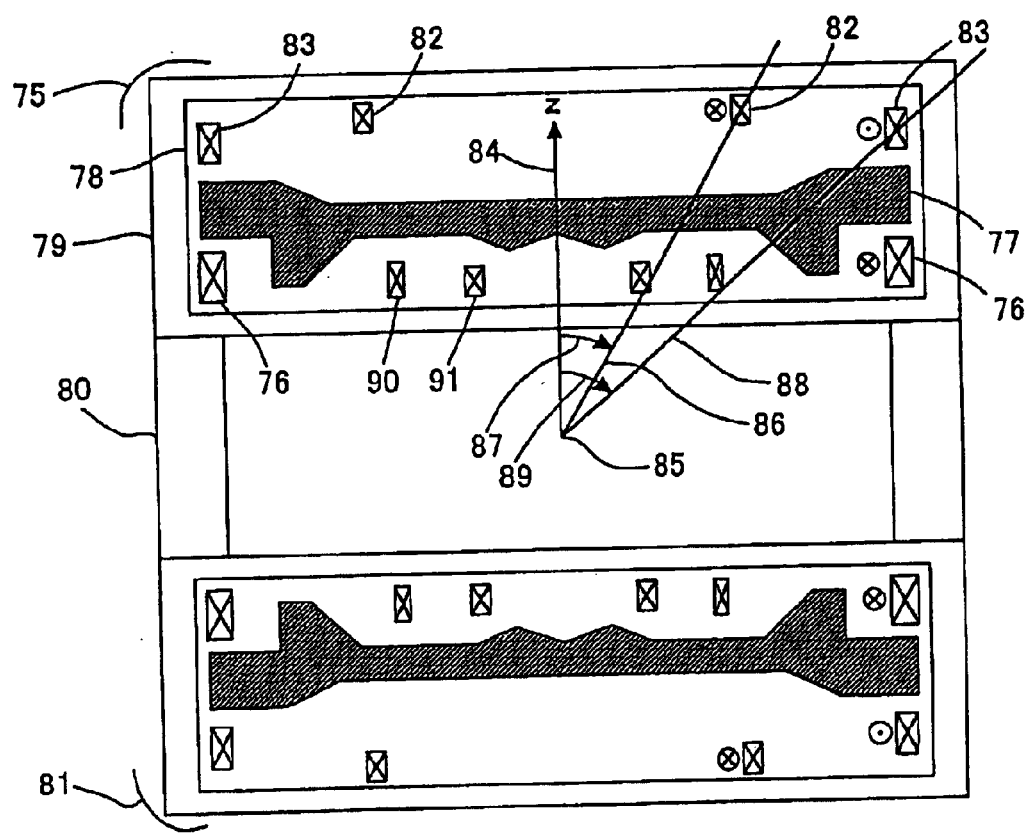
FIG. 5 shows a cross sectional view of superconducting magnets according to an embodiment of the present invention.

FIG. 5 shows a cross sectional view of the superconducting magnets in the open-type MRI apparatus according to another embodiment of the present invention. This embodiment adds a superconducting correction coil to the embodiment disclosed in FIG. 3 to further improve the uniformity of the magnetic field. The superconducting correction coils 90, 91, which are contained in a low temperature disclosure 78, can correct the magnetostatic field from the superconducting main coil 76 and magnetic pole 77 to further uniform the magnetic field. The superconducting shield coils 82, 83 are arranged in the same way as the shield coils in FIG. 3 and can control the higher order components of the leakage magnetic field to reduce the leakage magnetic field.

Figure 6:
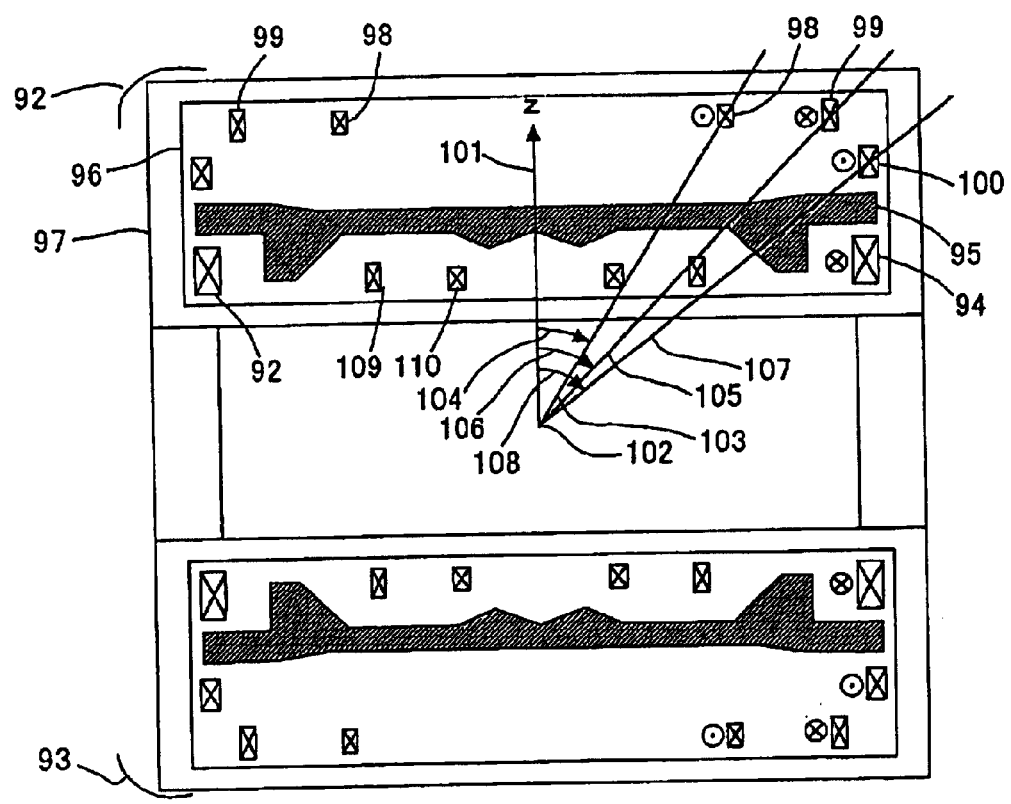
FIG. 6 shows a cross sectional view of superconducting magnets according to an embodiment of the present invention.

FIG. 6 shows a cross sectional view of the superconducting magnets in the open-type MRI apparatus according to another embodiment of the present invention. This embodiment adds a superconducting correction coil to the embodiment disclosed in FIG. 4 to further improve the uniformity of the magnetic field. The superconducting correction coils 109, 110 which are contained in a low temperature disclosure 94 can correct the magnetostatic field from the superconducting main coil 92 and magnetic pole 93 to further uniform the magnetic field. The superconducting shield coils 98, 99, and 100 are arranged in the same way as the shield coils in FIG. 4 and can control the higher order components of the leakage magnetic field to realize the lower leakage magnetic field.

Figure 7:
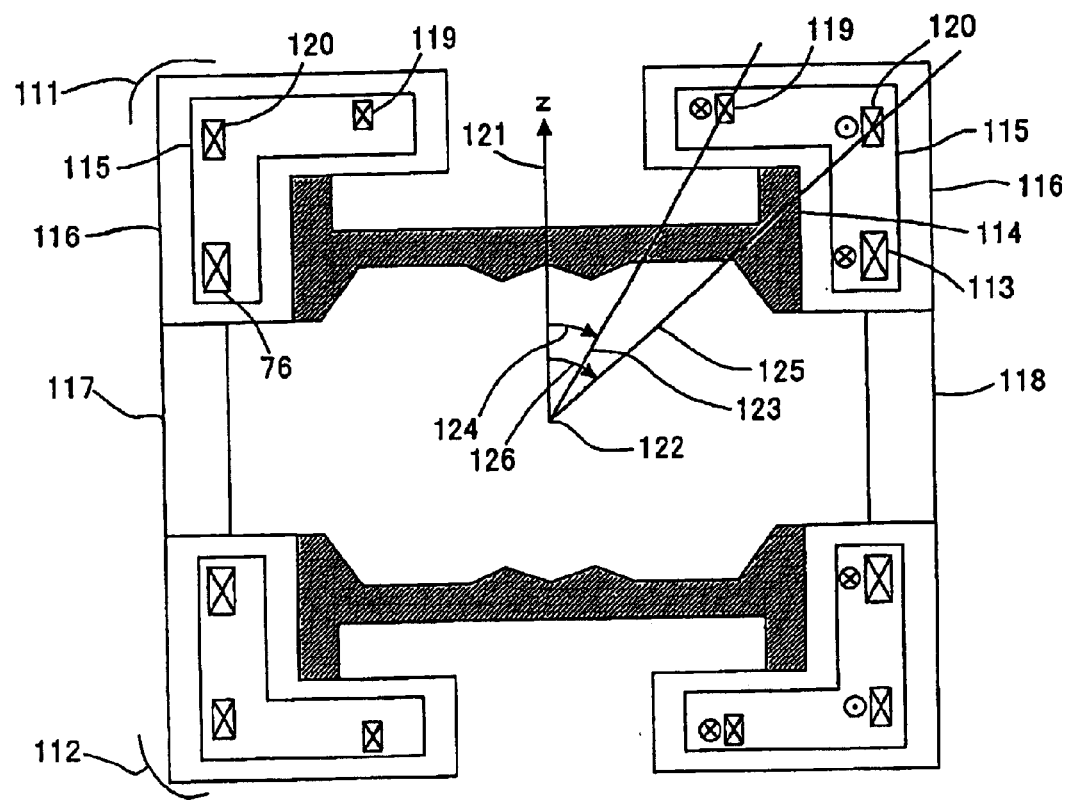
FIG. 7 shows a cross sectional view of superconducting magnets according to an embodiment of the present invention.

FIG. 7 shows a cross sectional view of the superconducting magnets in the open-type MRI apparatus according to another embodiment of the present invention. This embodiment uses a pair of the main coils and a pair of the magnet poles to produce a uniform magnetic field as with the embodiments in FIGS. 3 to 6. This embodiment, however, has the magnetic poles on the ambient temperature space side of the vacuum chamber 116 unlike the embodiments in FIGS. 3 to 6. In the upper magnet assembly 111, the superconducting main coil 113 and the two superconducting shield coils 119, 120 are contained in a low-temperature enclosure 115, which is in turn involved in a vacuum chamber 116.

Although not shown in FIG. 7 for simplicity, the device also has a support structure for the superconducting coils and has a heat shield between the vacuum chamber and low-temperature enclosure to prevent the penetration of heat radiation. The low-temperature enclosure contains liquid helium, which can cool the superconducting coils to a cryogenic temperature (4.2 K) to keep them in the superconducting state. The magnet pole 114 is on the ambient temperature space side of the vacuum chamber 116 and can produce a uniform magnetostatic field together with the superconducting main coil 113. The superconducting main coil 113 and superconducting shield coils 119, 120 are almost concentric with respect to the center axis 121 denoted as the z-axis in FIG. 4.

The center axis (z-axis) 121 passes through the center 122 of the magnets. In the cross section of FIG. 7, i.e., the cross section including the center axis (z-axis) 121, θ1, θ2 are defined as angles 124, 126 between the center axis (z-axis) 121 and half lines 123, 125, respectively, the half lines 123, 125 extending from the center 122 to the cross section geometric center of each of the superconducting shield coils 119, 120, respectively, and the θ1, θ2 are in a relation of θ1<θ2. If the superconducting main coil 113 is defined to have a positive current direction, then the superconducting shield coils 119, 120 corresponding to θ1, θ2, respectively, will have positive and negative current directions, respectively. This can be generalized in that the superconducting shield coils will have alternately positive and negative current directions with increasing value of the θn.

The superconducting shield coil 120 with the largest radius of the two superconducting shield coils may have a larger magnetomotive force in absolute value than the other. As described above, the superconducting shield coils in this embodiment can control the higher order components of the leakage magnetic field to provide the leakage magnetic field lower than that in the conventional magnets described above. This embodiment also uses the magnet pole 114 to produce a uniform magnetostatic field so that the superconducting main coil 113 may have a smaller magnetomotive force in absolute value than the superconducting main coils in the embodiments described above. The superconducting shield coils 119, 120 may then also have a smaller magnetomotive force in absolute value than the superconducting shield coils in the embodiments described above. Thus, the each shield coil may have a smaller electromagnetic force.

Figure 8:
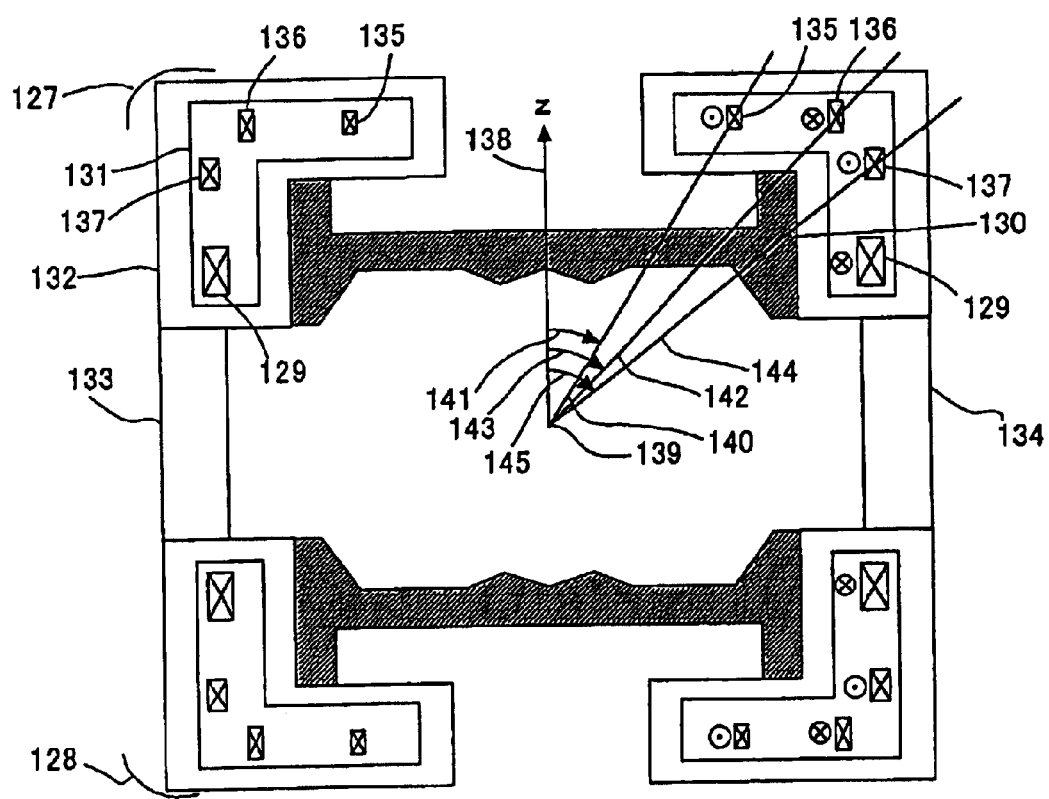
FIG. 8 shows a cross sectional view of superconducting magnets according to an embodiment of the present invention.

FIG. 8 shows a cross sectional view of the superconducting magnets in the open-type MRI apparatus according to another embodiment of the present invention. This embodiment uses a pair of the main coils and a pair of the magnet poles to produce a uniform magnetic field as with the embodiments in FIG. 7, and has the magnetic poles on the ambient temperature space side of the vacuum chamber 132. In the upper magnet assembly 127, the superconducting main coil 129 and the three superconducting shield coils 135, 136, and 137 are contained in a low-temperature enclosure 131, which is in turn involved in a vacuum chamber 132.

Although not shown in FIG. 8 for simplicity, the device also has a support structure for the superconducting coils and has a heat shield between the vacuum chamber and low-temperature enclosure to prevent the penetration of heat radiation. The low-temperature enclosure contains liquid helium, which can cool the superconducting coils to a cryogenic temperature (4.2 K) to keep them in the superconducting state. The magnet pole 130 is on the ambient temperature space side of the vacuum chamber 132 and can produce a uniform magnetostatic field together with the superconducting main coil 129. The superconducting main coil 129 and superconducting shield coils 135, 136, and 137 are almost concentric with respect to the center axis 138 denoted as the z-axis in FIG. 8.

The center axis (z-axis) 138 passes through the center 139 of the magnets. In the cross section of FIG. 8, i.e., the cross section including the center axis (z-axis) 138, $\theta 1$, $\theta 2$, and $\theta 3$ are defined as angles 141, 143, and 145 between the center axis (z-axis) 138 and half lines 140, 142, and 144, respectively, the half lines 140, 142, and 144 extending from the center 139 to the cross section geometric center of each of the superconducting shield coils 135, 136, and 137, respectively, and the $\theta 1$, $\theta 2$, and $\theta 3$ are in a relation of $\theta 1 < \theta 2 < \theta 3$. If the superconducting main coil 129 is defined to have a positive current direction, then the superconducting shield coils 135, 136, and 137 corresponding to $\theta 1$, $\theta 2$, and $\theta 3$, respectively, will have negative, positive, and negative current directions, respectively. This can be generalized in that the superconducting shield coils will have alternately positive and negative current directions with increasing value of the $\theta n$.

The superconducting shield coil 137 with the largest radius of the three superconducting shield coils may have a larger magnetomotive force in absolute value than the others. As described above, the superconducting shield coils in this embodiment can control the higher order components of the leakage magnetic field to provide the leakage magnetic field lower than that in the conventional magnets described above. This embodiment also uses the magnet pole 130 to produce a uniform magnetostatic field so that the superconducting main coil 129 may have a smaller magnetomotive force in absolute value than the superconducting main coils in the embodiments described above. The superconducting shield coils 135, 136, and 137 may then also have a smaller magnetomotive force in absolute value than the superconducting shield coils in the embodiments described above. Thus, the each shield coil may have a smaller electromagnetic force.

Figure 9:
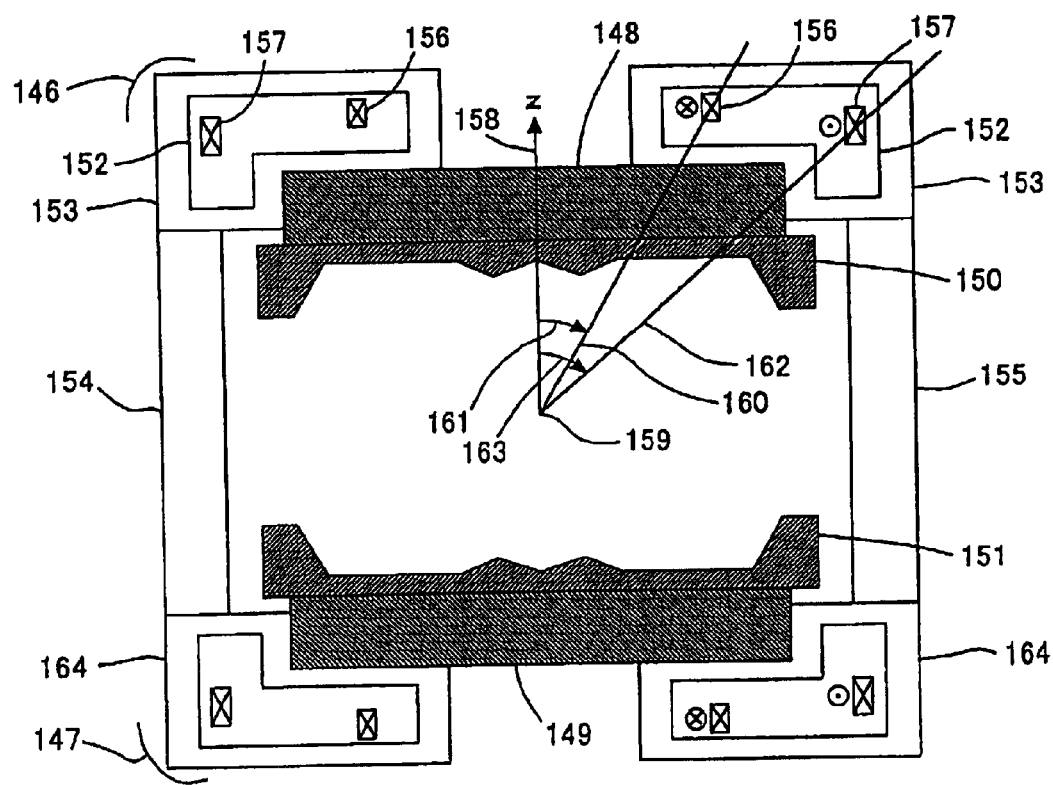
FIG. 9 shows a cross sectional view of superconducting magnets according to an embodiment of the present invention.

FIG. 9 shows a cross sectional view of the superconducting magnets in the open-type MRI apparatus according to another embodiment of the present invention. This embodiment uses a pair of permanent magnets 148, 149 as the magnetomotive force sources for the magnetostatic field. This embodiment also uses a pair of magnet poles 150, 151 as a means to make the magnetic field uniform. This embodiment has the permanent magnets 148, 149 and magnet poles 150, 151 on the ambient temperature space side of the vacuum chamber 153, 164, respectively.

The upper magnet assembly 146 will be described below. The superconducting shield coils 156, 157 are contained in a low-temperature enclosure 152, which is in turn involved in a vacuum chamber 153. Although not shown in FIG. 9 for simplicity, the device also has a support structure for the superconducting coils and has a heat shield between the vacuum chamber and low-temperature enclosure to prevent the penetration of heat radiation. The low-temperature enclosure contains liquid helium, which can cool the superconducting coils to a cryogenic temperature (4.2 K) to keep them in the superconducting state. The superconducting shield coils 156, 157 are almost concentric with respect to the center axis 158 denoted as the z-axis in FIG. 9. The center axis (z-axis) 158 passes through the center 159 of the magnets.

In the cross section of FIG. 9, i.e., the cross section including the center axis (z-axis) 158, $\theta 1$, $\theta 2$ are defined as angles 161, 163 between the center axis (z-axis) 158 and half lines 160, 162, respectively, the half lines 160, 162 extending from the center 158 to the cross section geometric center of each of the superconducting shield coils 156, 157, respectively, and the $\theta 1$, $\theta 2$ are in a relation of $\theta 1 < \theta 2$. The permanent magnets 148, 149 are magnetized almost in a positive direction along the z-axis, and can produce, together with the magnet poles 150, 151, a uniform magnetic field in a positive direction along the z-axis in the imaging space. To produce such a magnetic field direction with a coil concentric with respect to the z-axis, a current clockwise around the z-axis, such as the superconducting shield coil 156, may be provided. Thus, if the current direction equivalent to the magnetization direction of the permanent magnets 148, 149, i.e., the clockwise direction around the z-axis is defined as the positive current direction, the superconducting shield coils 156, 157 corresponding to $\theta 1$, $\theta 2$, respectively, will have positive and negative current directions, respectively.

This can be generalized in that the superconducting shield coils will have alternately positive and negative current directions with increasing value of the $\theta n$. The superconducting shield coil 157 with the largest radius of the two superconducting shield coils may have a larger magnetomotive force in absolute value than the other. As described above, the superconducting shield coils in this embodiment can control the higher order components of the leakage magnetic field to provide the lower leakage magnetic field. Although not shown in FIG. 7, the vacuum chambers 153, 164 and connecting tubes 154, 155 mechanically support the permanent magnets 148, 149 and magnet poles 150, 151.

However, a T-shape structure may also hold the upper and lower permanent magnets 148, 149 and magnet poles 150, 151. It should be appreciated that the present embodiment does not limit the mechanical structure of the magnets.

Figure 10:
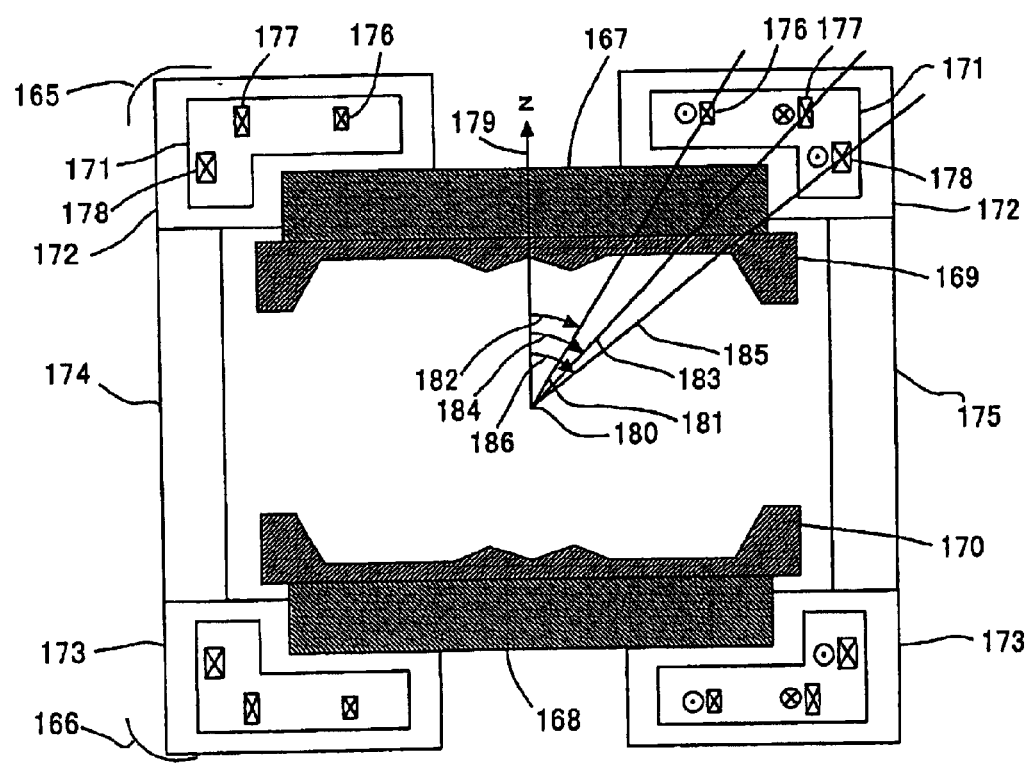
FIG. 10 shows a cross sectional view of superconducting magnets according to an embodiment of the present invention.

FIG. 10 shows a cross sectional view of the superconducting magnets in the open-type MRI apparatus according to another embodiment of the present invention. Unlike the embodiment disclosed in FIG. 9, the present embodiment uses three pairs of the superconducting shield coils. The upper magnet assembly 165 will be described below. The superconducting shield coils 176, 177, and 178 are almost concentric with respect to the center axis 179 denoted as the z-axis in FIG. 10. The center axis (z-axis) 179 passes through the center 180 of the magnets.

In the cross section of FIG. 10, i.e., the cross section including the center axis (z-axis) 179, θ1, θ2, and θ3 are defined as angles 182, 184, and 186 between the center axis (z-axis) 179 and half lines 181, 183, and 185, respectively, the half lines 181, 183, and 185 extending from the center 180 to the cross section geometric center of each of the superconducting shield coils 176, 177, and 178, respectively, and the θ1, θ2, and θ3 are in a relation of θ1<θ2<θ3. The permanent magnets 167, 168 are magnetized almost in a positive direction along the z-axis, and can produce, together with the magnet poles 169, 170, a uniform magnetic field in a positive direction along the z-axis in the imaging space.

To produce such a magnetic field direction with a coil concentric with respect to the z-axis, a current clockwise around the z-axis, such as the superconducting shield coil 177, may be provided. Thus, if the current direction equivalent to the magnetization direction of the permanent magnets 167, 168, i.e., the clockwise direction around the z-axis is defined as the positive current direction, the superconducting shield coils 176, 177, and 178 corresponding to θ1, θ2, and θ3 respectively, will have negative, positive, and negative current directions, respectively. This can be generalized in that the superconducting shield coils will have alternately positive and negative current directions with increasing value of the θn.

The superconducting shield coil 178 with the largest radius of the three superconducting shield coils may have a larger magnetomotive force in absolute value than the others. As described above, the superconducting shield coils in this embodiment can control the higher order components of the leakage magnetic field to provide the lower leakage magnetic field. Although not shown in FIG. 10, the vacuum chambers 172, 173 and connecting tubes 174, 175 mechanically support the permanent magnets 167, 168 and magnet poles 169, 170. However, a T-shape structure may also hold the upper and lower permanent magnets 167, 168 and magnet poles 169, 170. It should be appreciated that the present embodiment does not limit the mechanical structure of the magnets.

The superconducting magnets in the open-type MRI apparatus according to the embodiments of the present invention have been disclosed. The description below will disclose the coil arrangement and the leakage magnetic field distribution, which are derived from a computer program using the equation (3), for the air-core magnets shown in FIGS. 1 and 2. The coil arrangement will be disclosed for the z>0 area of the mirror symmetric space with respect to the z=0 plane. The calculation condition is that the central magnetic field strength is 0.75T, the magnetic field is uniform to such an extent that the expansion coefficients of the second to tenth order in the equation (2) vanish in the uniform magnetic field area, and every case will have ±3 ppm/45 cm DSV.

Figure 11:
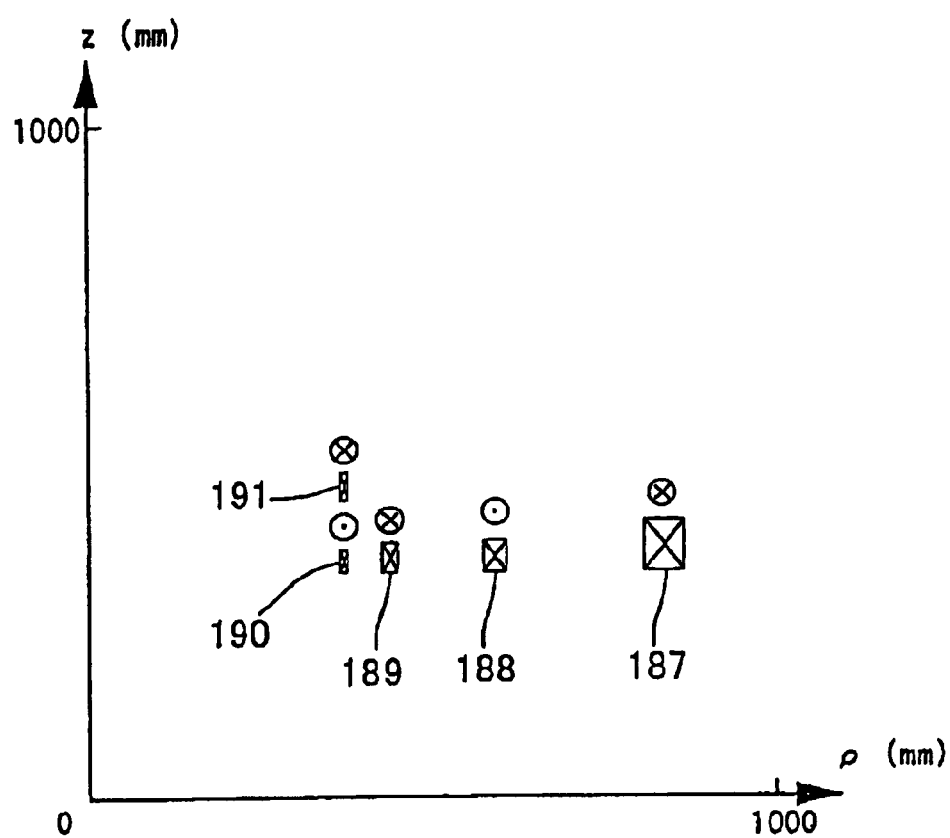
FIG. 11 shows a cross sectional view of a conventional coil arrangement.

FIG. 11 illustrates the coil arrangement where the shield coils are not used, i.e., the leakage magnetic field is not controlled. Five main coils 187, 188, 189, 190, 191 are arranged such that they have alternately positive and negative current directions. The foregoing patent "MAGNET APPARATUS AND MRI APPARATUS" discloses such a main coils arrangement. There are symbols near the coils to show the coils' electric current directions.

Figure 12:
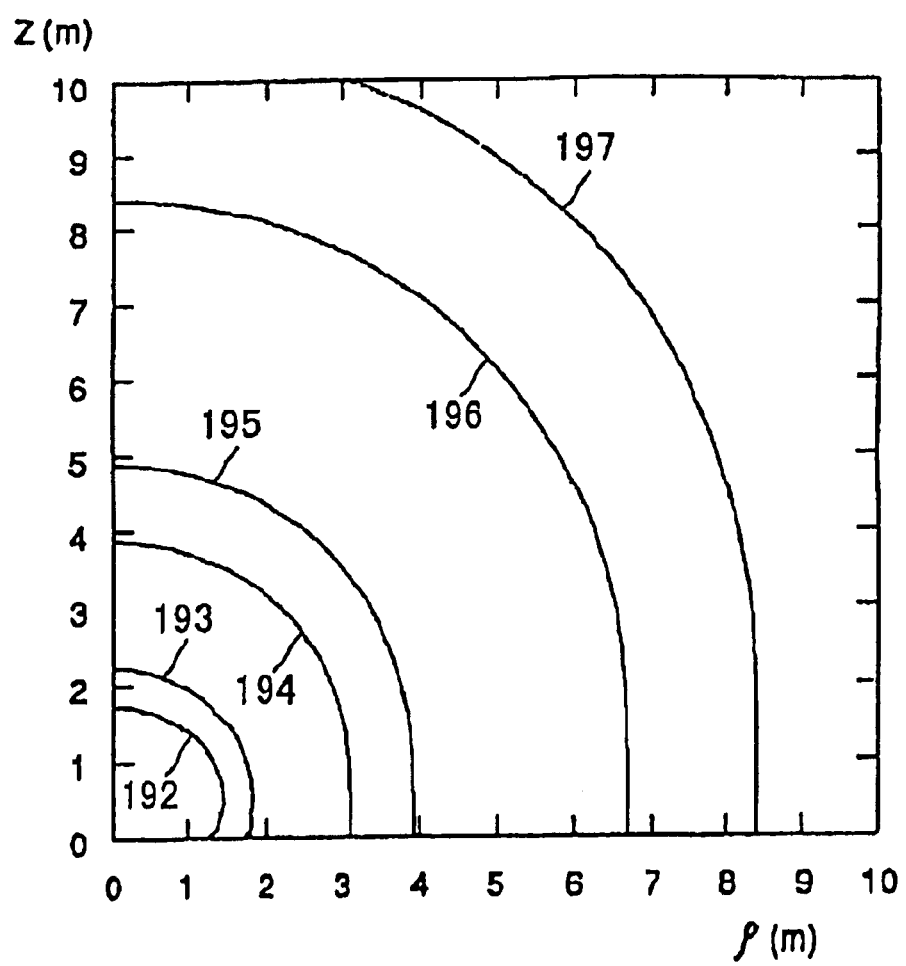
FIG. 12 shows a leakage magnetic field distribution from the conventional coil arrangement in FIG. 11.

FIG. 12 shows a leakage magnetic field distribution from the coil arrangement in FIG. 11. FIG. 12 shows the contour plot of the leakage magnetic field strength including, from the inside, the 1000 gauss contour 192, 500 gauss contour 193, 100 gauss contour 194, 50 gauss contour 195, 10 gauss contour 196, and 5 gauss contour 197. One guideline for the MRI apparatus installation in the hospital is that the 5 gauss contour of the leakage magnetic field is within 3 meters from the origin. FIG. 12 shows the 5 gauss contour 197 of the leakage magnetic field far beyond 10 meters along the z-axis.

Figure 13:
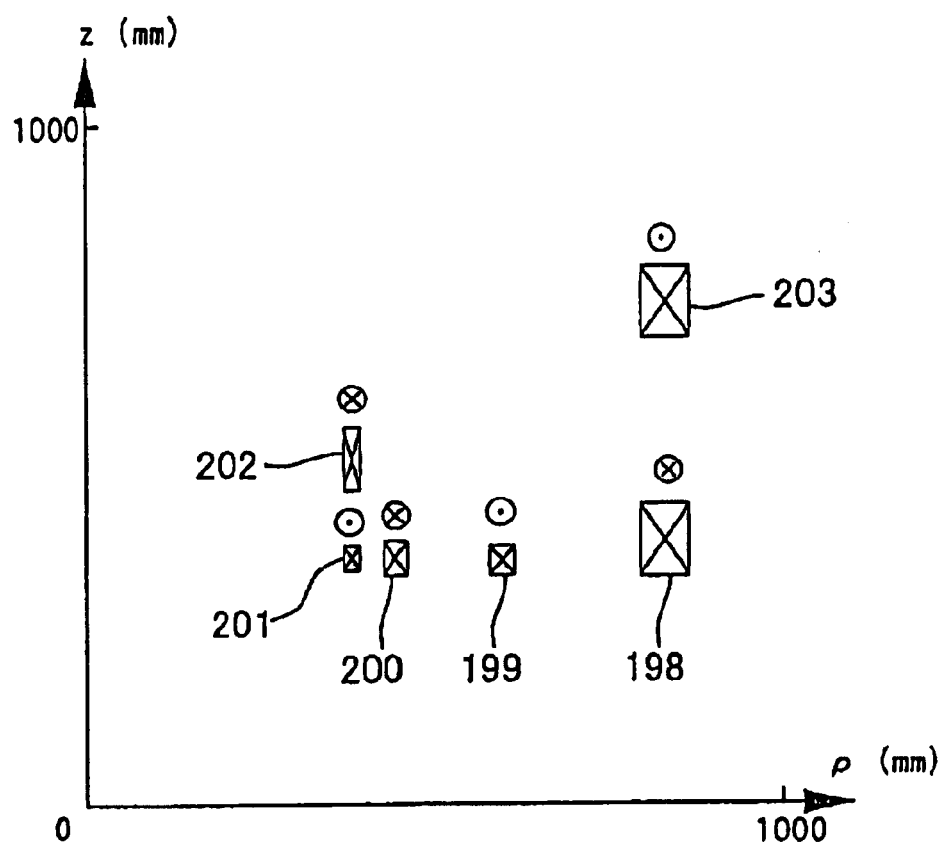
FIG. 13 shows a cross sectional view of a conventional coil arrangement.

FIG. 13 shows a coil arrangement derived with an additional condition that first order component of the leakage magnetic field expanded in the equation (3) only vanishes. In addition to the main coils 198, 199, 200, 201, and 202 corresponding to the main coils in FIG. 11, the arrangement includes a pair of shield coils 203. Each main coil has a larger magnetomotive force in absolute value than the main coils in FIG. 11, and the central magnetic field strength and magnetic field uniformity are the same as those in FIG. 11.

Figure 14:
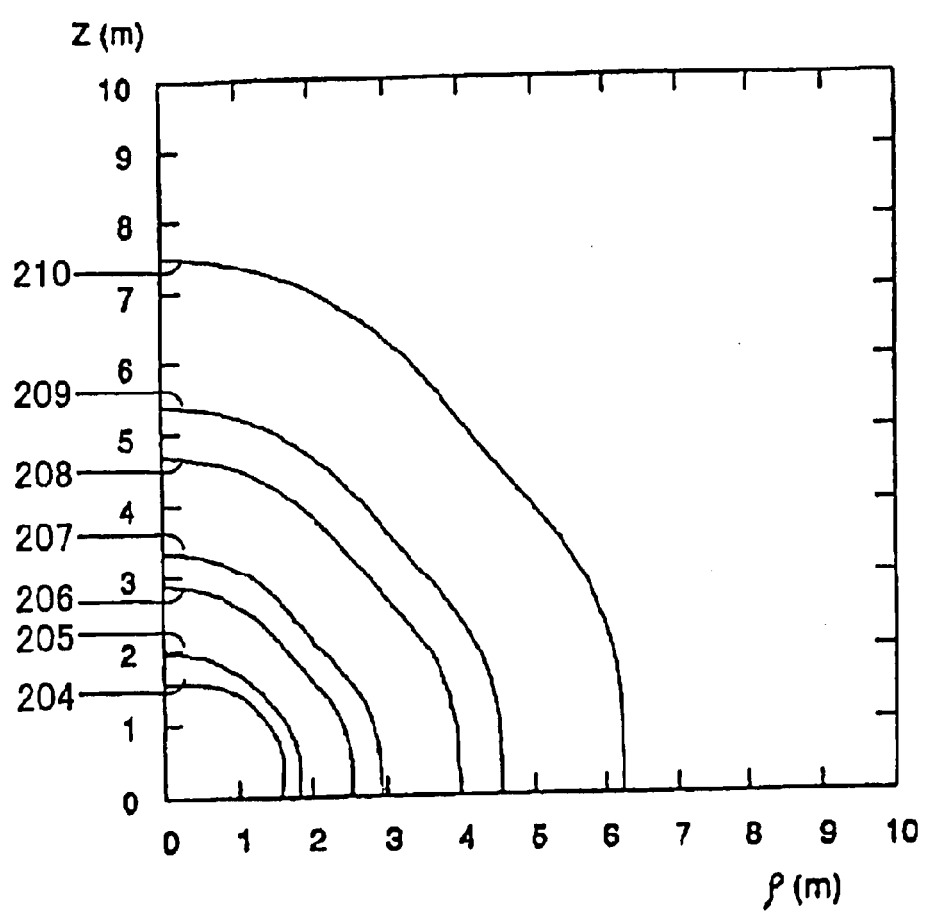
FIG. 14 shows a leakage magnetic field distribution of the conventional coil arrangement in FIG. 13.

FIG. 14 shows a leakage magnetic field distribution from the coil arrangement in FIG. 13. The distribution includes, from the inside, the 1000 gauss contour 204, 500 gauss contour 205, 100 gauss contour 206, 50 gauss contour 207, 10 gauss contour 208, 5 gauss contour 209, and 1 gauss contour 210. The 5 gauss contour 209 is smaller than that when the shield coils are not used as shown in FIG. 12, but is still 5 meters which is too large to install the MRI apparatus in the hospital. The conventional shield coil arrangements described above are all similar to the coil arrangement shown in FIG. 13 so that they can significantly increase the third order component of the leakage magnetic field as described above and have the large leakage magnetic field distribution as shown in FIG. 14. The leakage magnetic field in FIG. 14 expanded in the equation (3) shows a dominant third order component and has a magnetic field distribution which decreases in proportion to the fifth negative power of distance from the origin.

Figure 15:
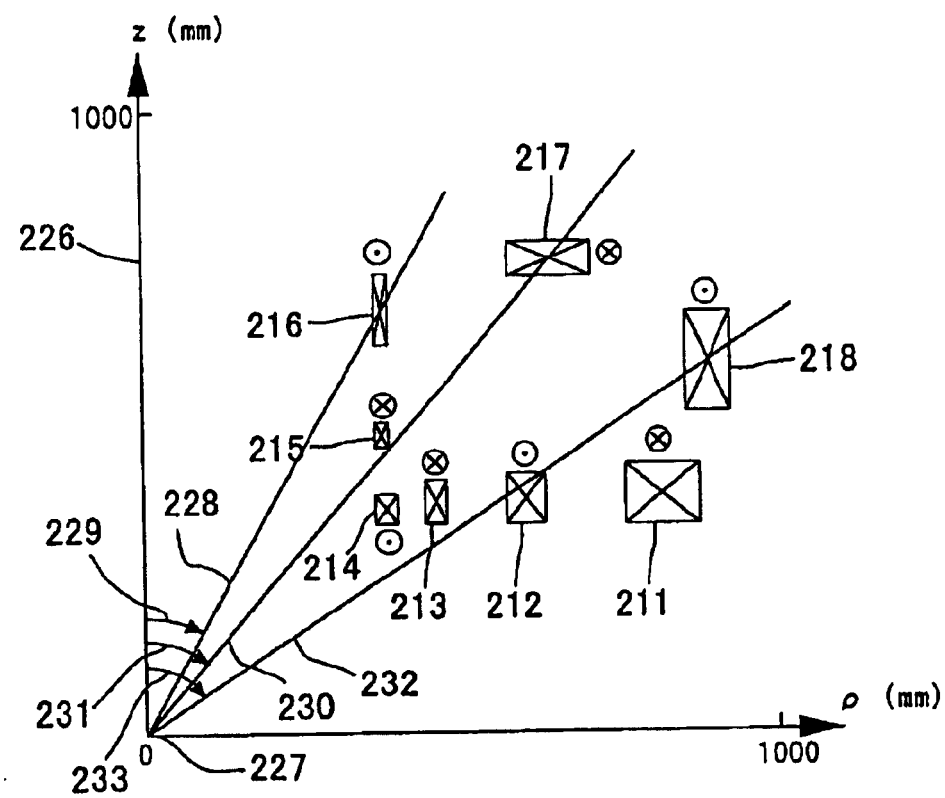
FIG. 15 shows a cross sectional view of the coil arrangement according to the present invention.

FIG. 15 shows a coil arrangement under the condition that the magnetic field is uniform and the additional condition that the first and third order components of the leakage magnetic field expanded in the equation (3) vanish. In addition to the main coils 211, 212, 213, 214, and 215 corresponding to the main coils in FIG. 11, the arrangement includes three pairs of shield coils 216, 217, and 218. Each main coil has a larger magnetomotive force in absolute value than the main coils in FIG. 11, and the central magnetic field strength and magnetic field uniformity are the same as those in FIG. 11.

Figure 16:
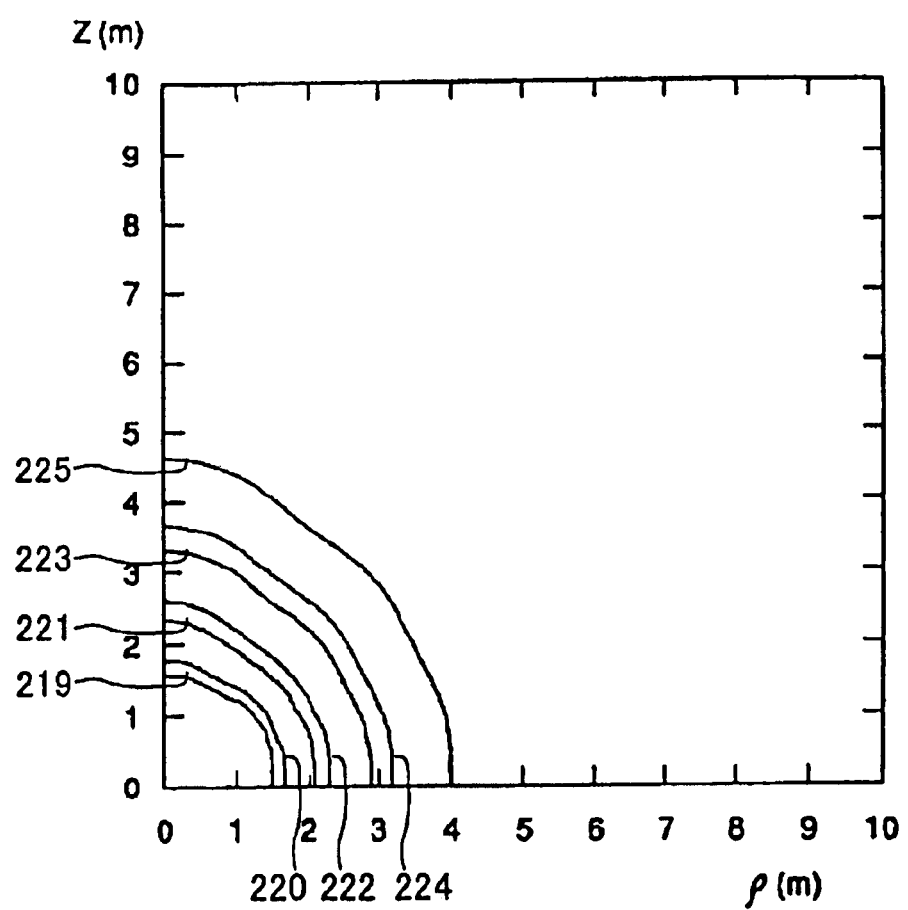
FIG. 16 shows a leakage magnetic field distribution of the coil arrangement according to the present invention in FIG. 15.
Figure 17:
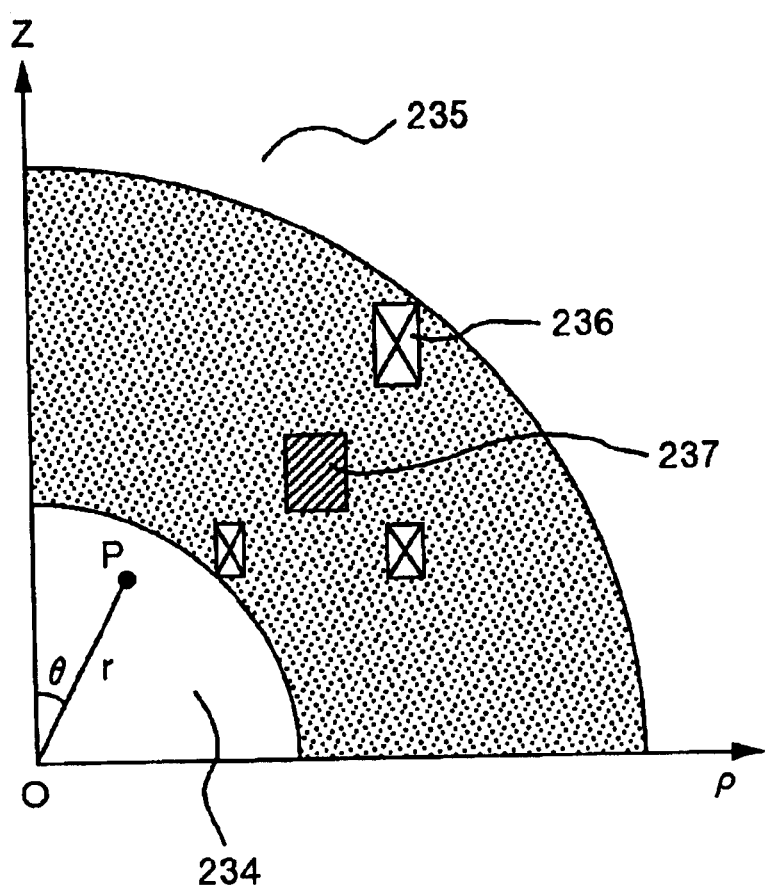
FIG. 17 shows an axial symmetric two dimensional cross section and internal and external regions of a system of coils and magnetic materials.
Figure 18:
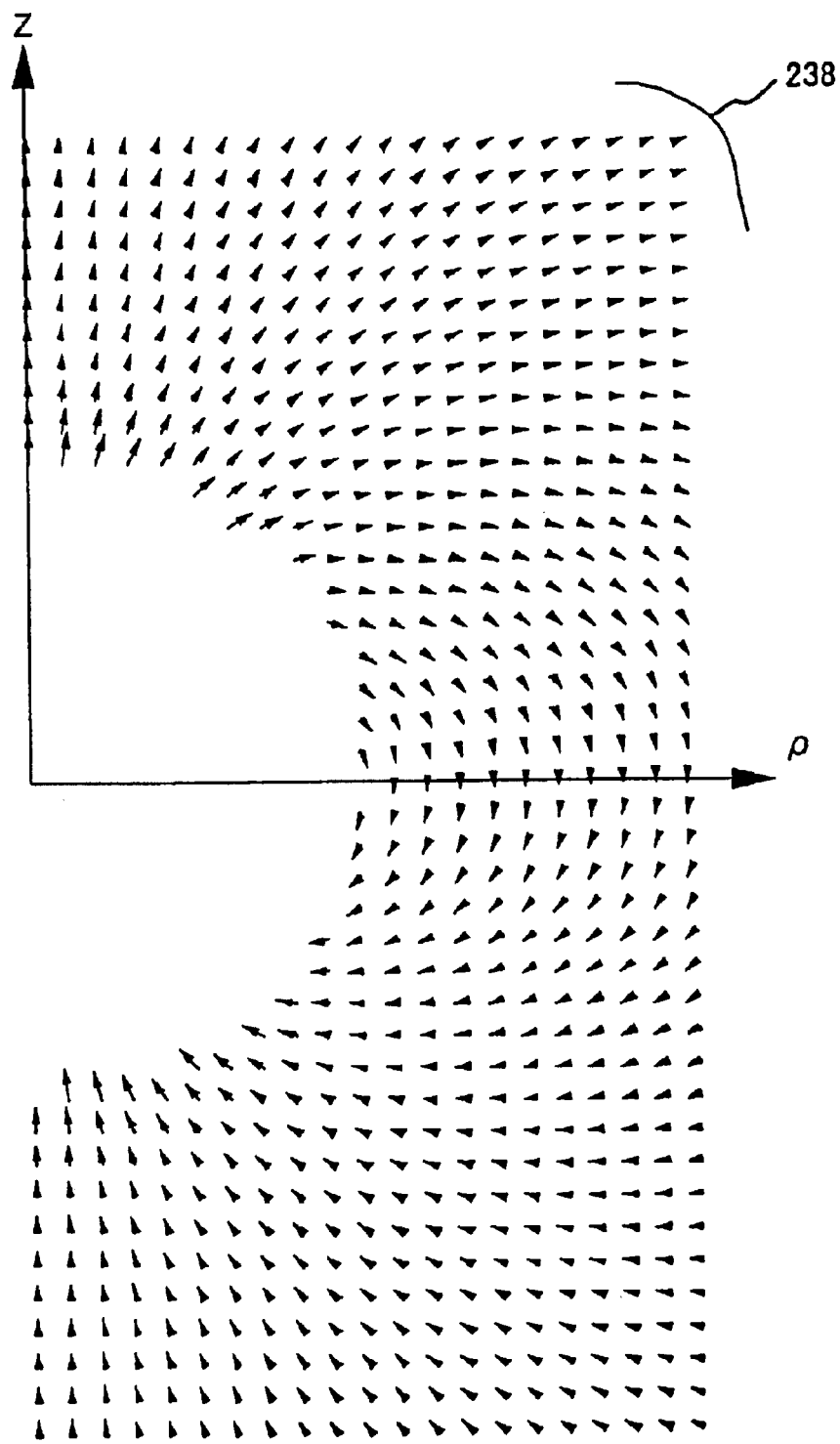
FIG. 18 shows a space distribution of the first order component of the leakage magnetic field in the external region.
Figure 19:
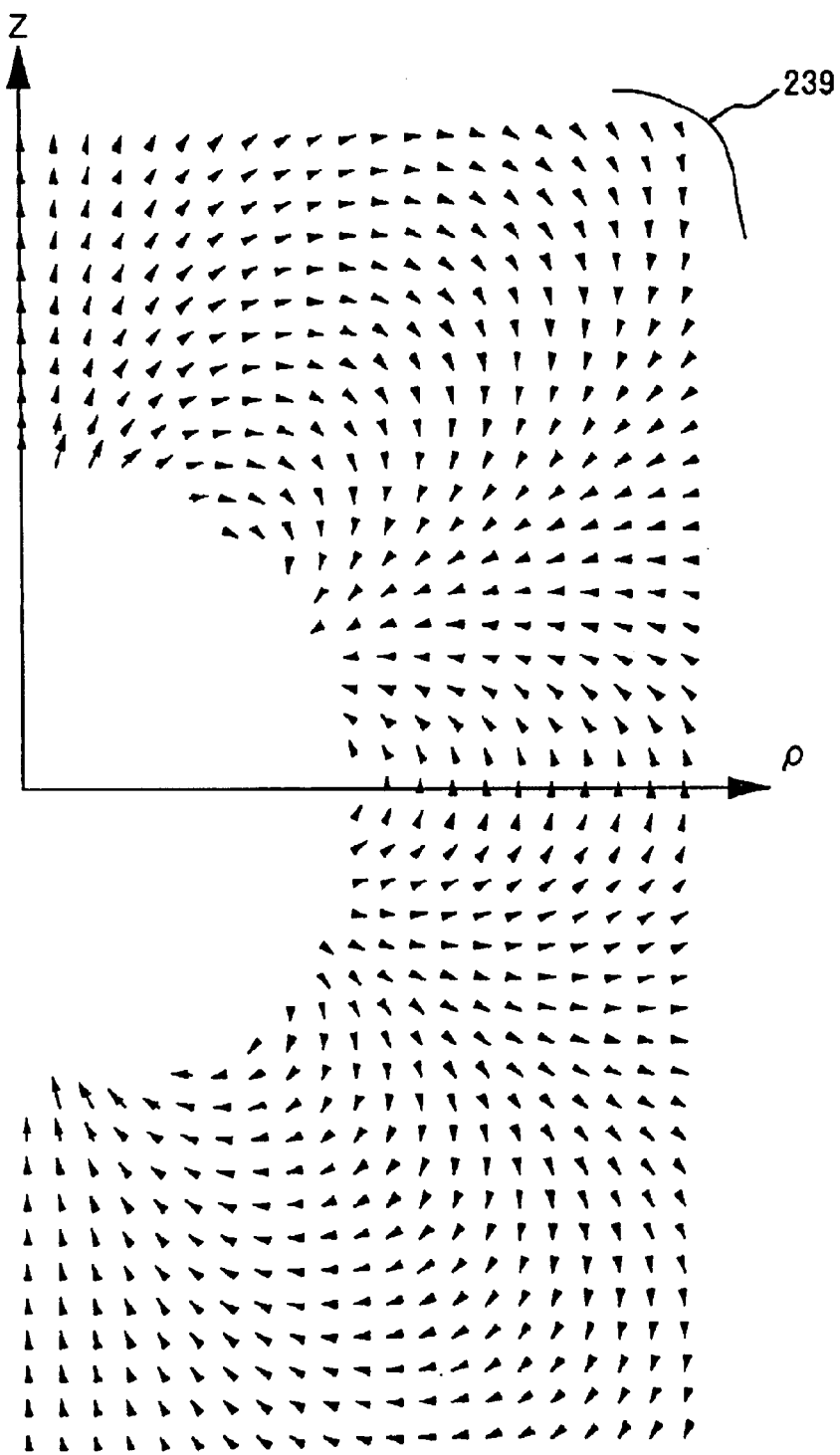
FIG. 19 shows a space distribution of the third order component of the leakage magnetic field in the external region.
Figure 20:
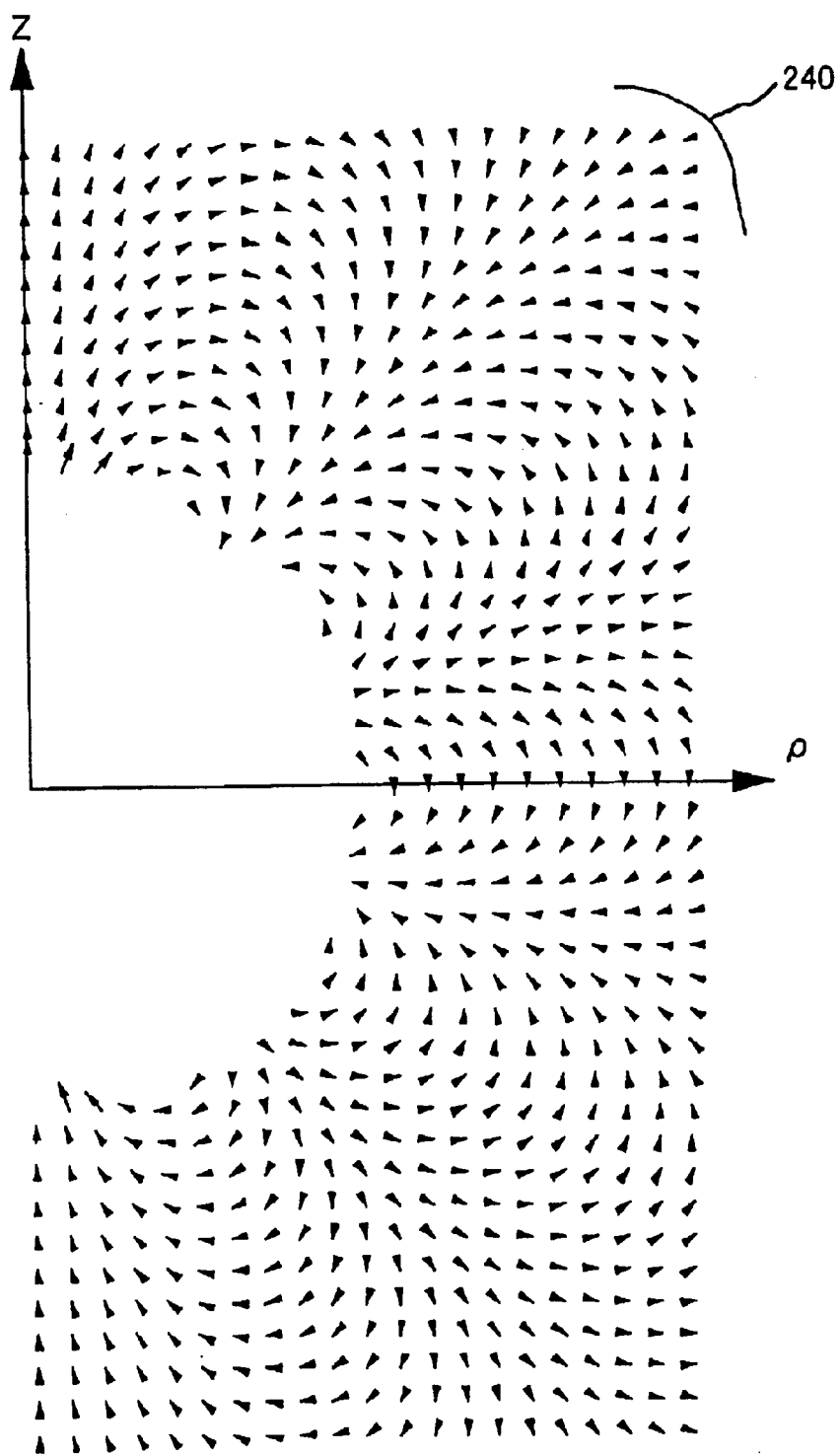
FIG. 20 shows a space distribution of the fifth order component of the leakage magnetic field in the external region.
Figure 21:
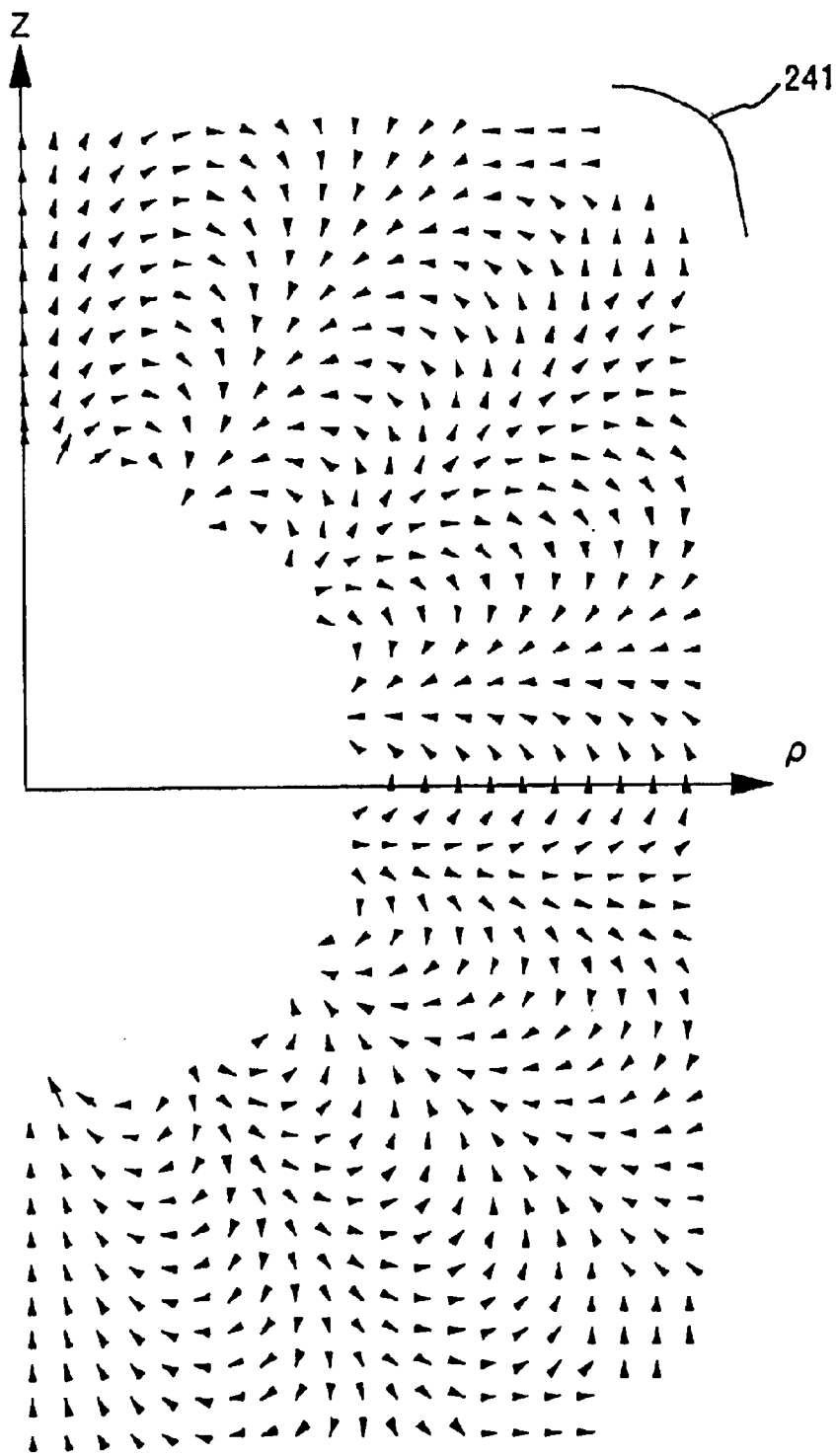
FIG. 21 shows a space distribution of the seventh order component of the leakage magnetic field in the external region.
Figure 22:
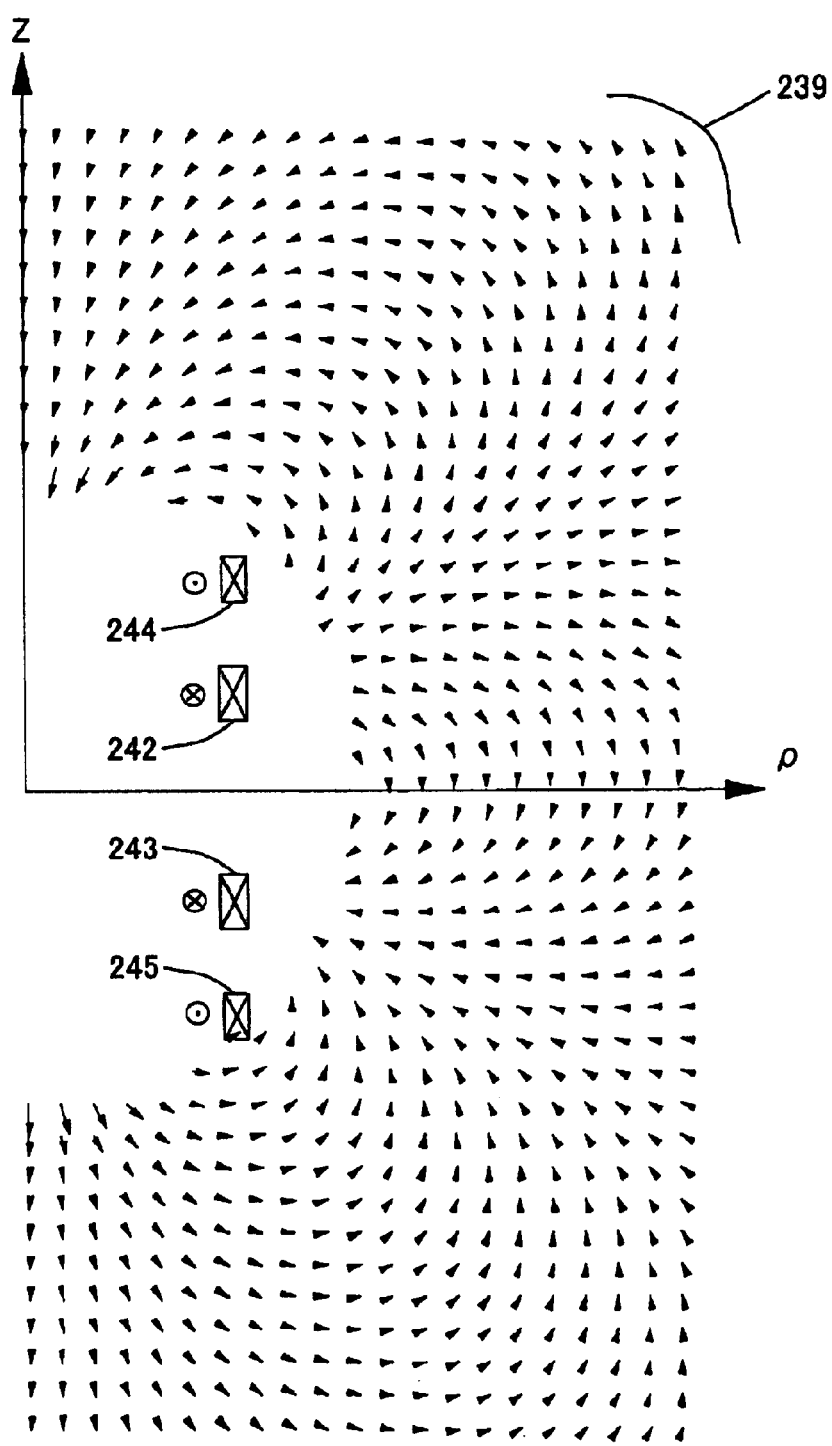
FIG. 22 illustrates the principle by which the conventional shield coil arrangement may significantly increase the third order component of the leakage magnetic field.
Figure 23:
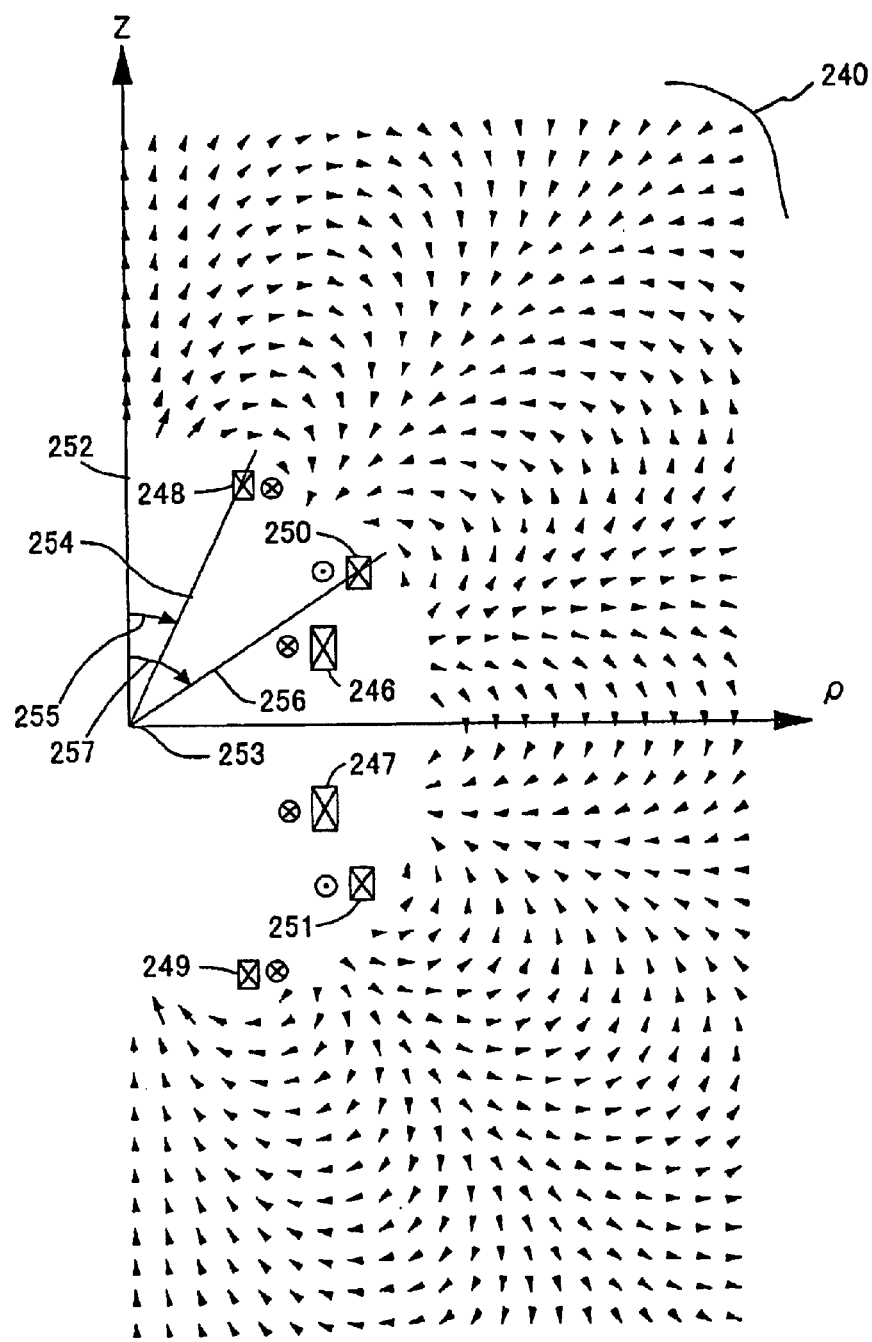
FIG. 23 shows a shield coil arrangement corresponding to the fifth order component of the leakage magnetic field.
Figure 24:
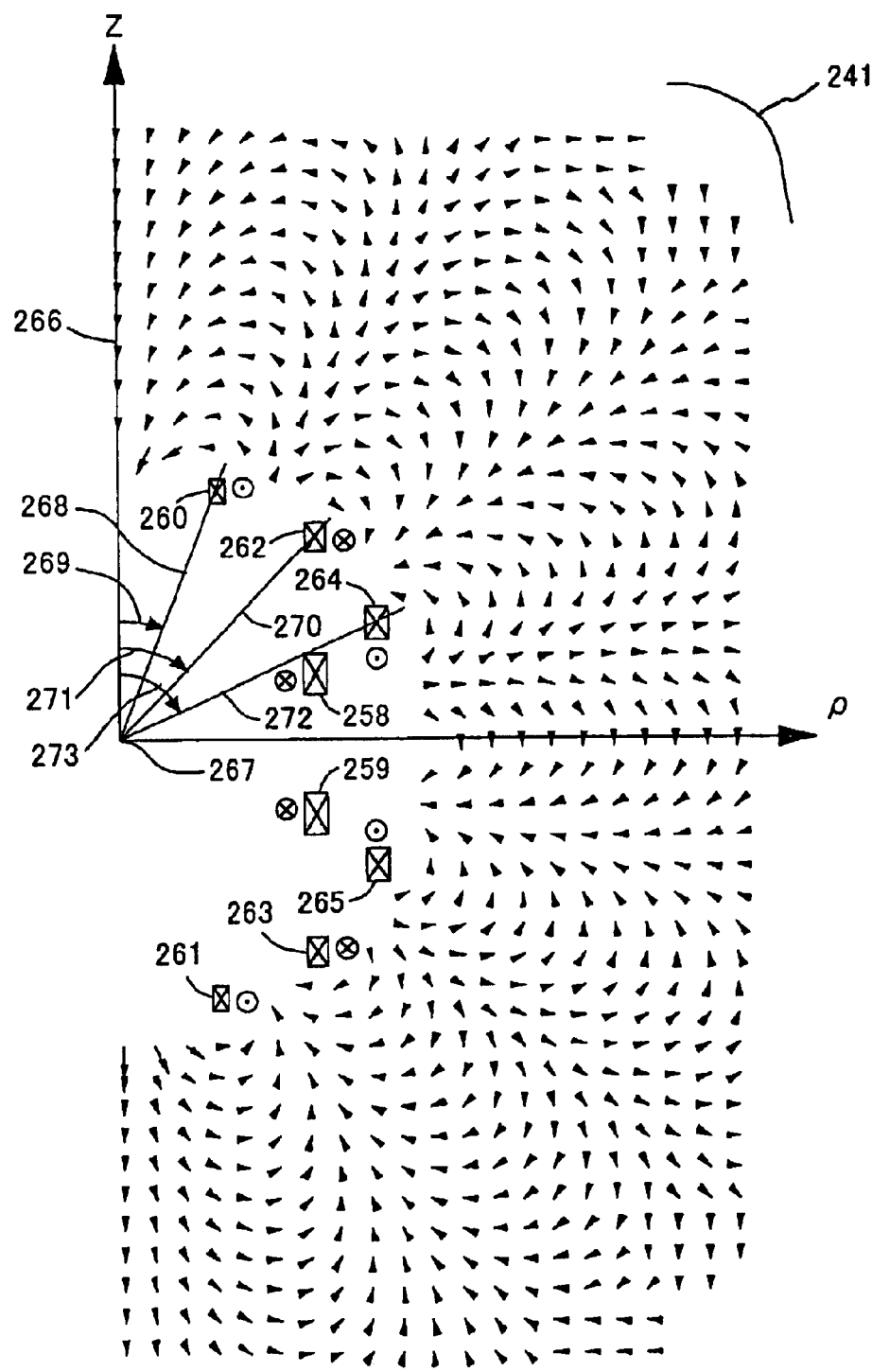
FIG. 24 shows a shield coil arrangement corresponding to the seventh order component of the leakage magnetic field.

FIG. 16 shows a leakage magnetic field distribution from the coil arrangement in FIG. 15. The distribution includes, from the inside, the 1000 gauss contour 219, 500 gauss contour 220, 100 gauss contour 221, 50 gauss contour 222, 10 gauss contour 223, 5 gauss contour 224, and 1 gauss contour 225. The leakage magnetic field is successfully significantly decreased and the 5 gauss contour 224 is between 3 and 3.5 meters. The 1 gauss contour 225 is also very small. In this embodiment, the first and third order components of the leakage magnetic field expanded in the equation (3) vanish, so that the fifth order component of the leakage magnetic field is dominant and the leakage magnetic field strength decreases very rapidly in proportion to the seventh negative power of distance from the origin.

In this embodiment, θ1, θ2, and θ3 are defined as angles between the z-axis 226 and half lines 228, 230, and 232, respectively, the half lines 228, 230, and 232 extending from the origin 227 to the cross section geometric center of each of the superconducting shield coils 216, 217, and 218, respectively, and the θ1, θ2, and θ3 are in a relation of θ1<θ2<θ3. The corresponding shield coils have alternately positive and negative current directions. The shield coil 218 with the largest radius of the shield coils has a larger magnetomotive force in absolute value than the others. In this embodiment he shield coil 218 with the largest radius has a larger average radius than the main coil 211 of the largest average radius.

Figure 25:
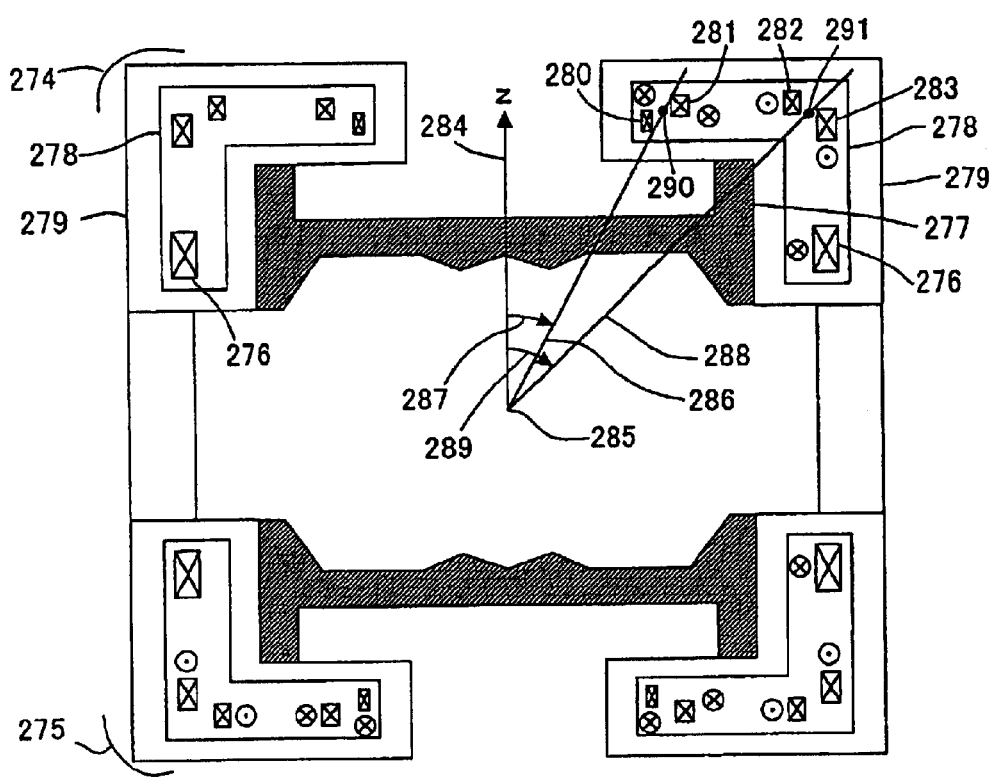
FIG. 25 shows a cross sectional view of superconducting magnets according to an embodiment of the present invention.

FIG. 25 shows the superconducting magnets in the open-type MRI apparatus according to another embodiment of the present invention, which has the leakage magnetic field performance equivalent to that of the magnets in FIG. 7. The superconducting shield coil 120 in FIG. 7 is divided into two superconducting shield coils 281, 282 in the embodiment in FIG. 25. Alternatively, it may be conceived that a superconducting shield coil 282 of a lower magnetomotive force replaces the superconducting shield coil 120, and another superconducting shield coil 281 is added.

It is well-known to those skilled in the art that if an electromagnetic force or the maximum empirical magnetic field for one superconducting coil is too large to form a superconducting coil, the coil can be divided into more than one coil as in this embodiment to reduce the electromagnetic force or the maximum empirical magnetic field. The present invention also meets the following condition to reduce the leakage magnetic field from the divided coils as described above.

The superconducting main coils are defined to have a positive current direction. The shield coils 280, 281 of positive current directions make up a first group of shield coils. The shield coils 282, 283 of negative current directions make up a second group of shield coils. θ1 is defined as an angle 287 between the z-axis 284 and a half line 286 extending from the origin 285 to the cross section geometric center 290 of the shield coils 280, 281 of the first group. θ2 is defined as an angle 289 between the z-axis 284 and a half line 288 extending from the origin 285 to the cross section geometric center 291 of the shield coils 282, 283 of the second group. The θ1, θ2 are in a relation of θ1<θ2, and the corresponding groups of shield coils have alternately positive and negative current directions. The second group of shield coils including the largest radius shield coil 283 has a larger sum of the magnetomotive force in absolute value than the other groups.

Figure 26:
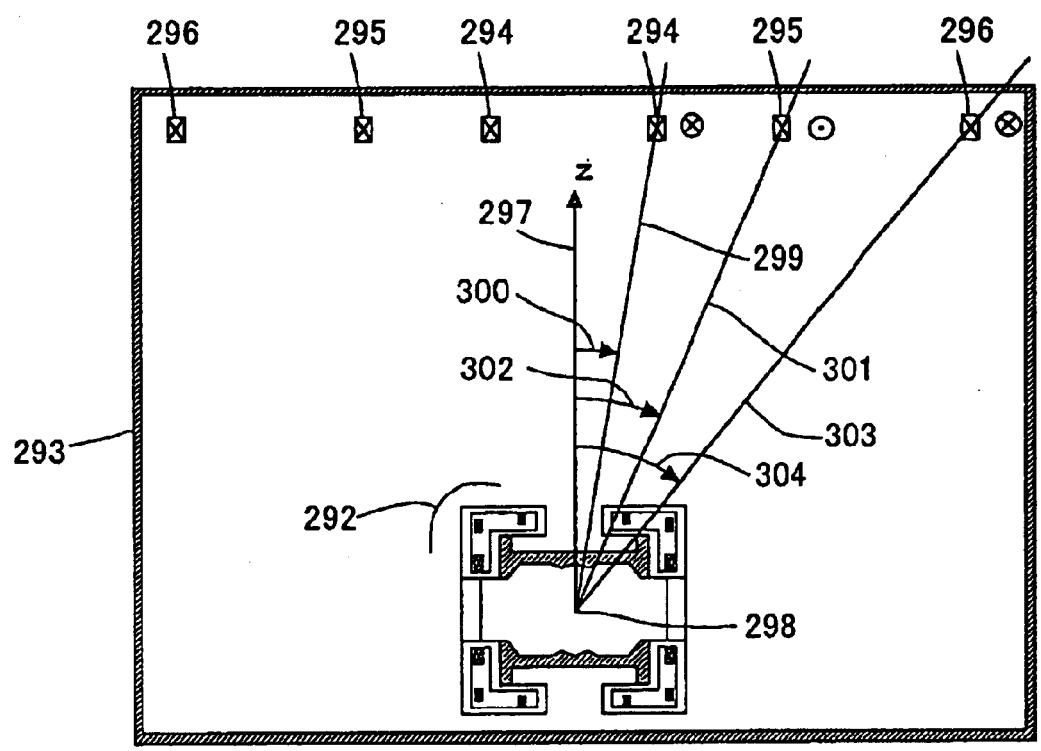
FIG. 26 shows a cross sectional view of superconducting magnets, normal conducting shield coils, and a MRI scan room according to an embodiment of the present invention.

FIG. 26 shows a normal conducting shield coil according to another embodiment of the present invention. The MRI magnets 292 are disposed in the MRI scan room 293 in a hospital. In this embodiment, the magnets 292 are open-type magnets and produce a uniform magnetic field in the imaging space along the magnet center axis 297 denoted as the z-axis in FIG. 26. The coils in the open-type magnet 292 are almost concentric with respect to the magnet center axis 297 denoted as the z-axis. The normal conducting shield coils 294, 295, and 296 are on the ambient temperature side of the vacuum chamber for the superconducting magnets almost concentrically with respect to the center axis 297. This embodiment has the normal conducting shield coils around the ceiling of the MRI scan room.

If θ1, θ2, and θ3 are defined as angles 300, 302, and 304 between the center axis 297 and half lines 299, 301, and 303, respectively, the half lines 299, 301, and 303 extending from the magnet center 298 to each of the normal conducting shield coils 294, 295, and 296, respectively, then the θ1, θ2, and θ3 are in a relation of θ1<θ2<θ3 and the shield coils corresponding to the θ1, θ2, and θ3 have alternately positive and negative current directions. As described above, the normal conducting shield coils in this embodiment can control the higher order components of the leakage magnetic field to prevent the magnetic field leakage above the MRI scan room 293. Although not shown in this embodiment, the device also has a support structure for the normal conducting coils which fastens the normal conducting shield coils on the wall of the MRI scan room 293. Alternatively, the normal conducting shield coils may be fastened on the magnet 292.

Figure 27:
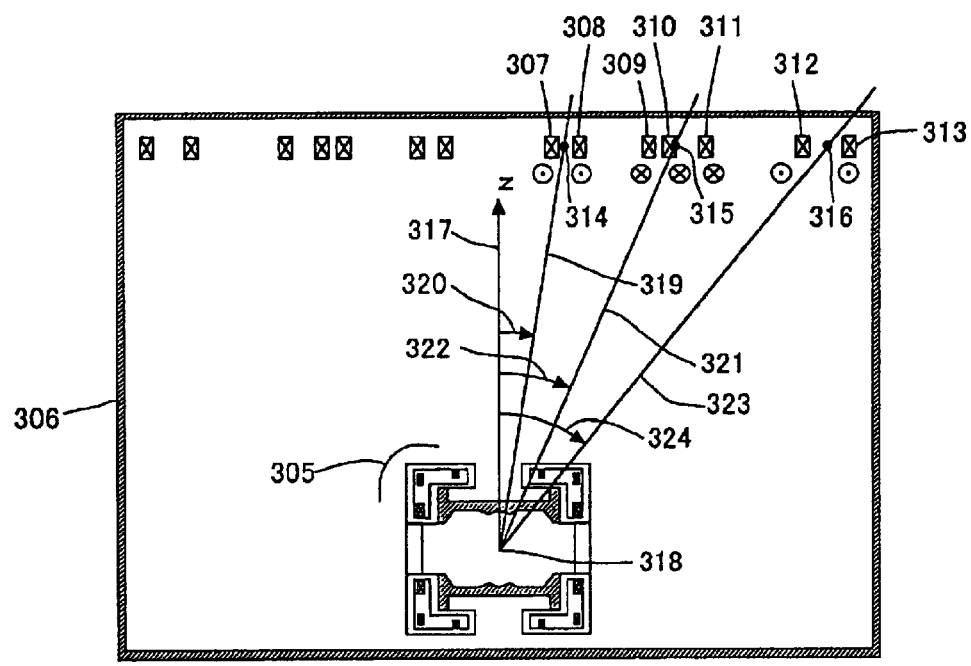
FIG. 27 shows a cross sectional view of superconducting magnets, normal conducting shield coils, and a MRI scan room according to an embodiment of the present invention.

FIG. 27 shows a normal conducting shield coil according to another embodiment of the present invention. In this embodiment, more than one group of shield coils make up the shield coils having an effect equivalent to that of the shield coils shown in FIG. 26. The normal conducting shield coils 307, 308 make up a first group of shield coils. The normal conducting shield coils 309, 310, and 311 make up a second group of shield coils. The normal conducting shield coils 312, 313 make up a third group of shield coils. θ1 is defined as an angle 320 between the magnet center axis 317 and a half line 319 extending from the magnet center 318 to the cross section geometric center 314 of the first group shield coils. θ2 is defined as an angle 322 between the magnet center axis 317 and a half line 321 extending from the magnet center 318 to the cross section geometric center 315 of the second group shield coils. θ3 is defined as an angle 324 between the magnet center axis 317 and a half line 323 extending from the magnet center 318 to the cross section geometric center 316 of the second group shield coils. The θ1, θ2, and θ3 are in a relation of θ1<θ2<θ3, and the shield coil groups corresponding to θ1, θ2, and θ3 have alternately positive and negative current directions.

As described above, the normal conducting shield coils in this embodiment can control the higher order components of the leakage magnetic field to prevent the magnetic field leakage above the MRI scan room 306. The coils of the magnet 305 and the shield coils are almost concentric with respect to the magnet center axis 317 denoted as the z-axis in FIG. 27. Although the embodiments shown in FIGS. 26 and 27 have the normal conducting shield coils only above the magnet, the normal conducting shield coils may be disposed below the magnet in the same manner to reduce the magnetic field leakage below the MRI scan room.

The present invention has been described in the specific embodiments. In the embodiments described above, the coils in the magnet are all superconducting coils. However, the present invention is not limited to the superconducting coils and may use any current carrying means such as a coil of copper wire.

The present invention can be implemented in a variety of embodiments as described above. However, it should be appreciated that the present invention is not limited by any embodiment disclosed here.

The symbols used here are as follows:

17, 19, 53, 56, 75, 92, 111, 127, 146, 165, 274 . . . upper magneto-static field-generating source; 18, 20, 54, 57, 81, 93, 112, 128, 147, 166, 275 . . . lower magneto-static field-generating source; 1, 2, 3, 4, 21, 22, 23, 24, 40, 58, 76,

94, 113, 129, 276 . . . superconducting main coil; 9,10, 29, 30, 31, 45, 46, 64, 65, 66, 82, 83, 98, 99, 100, 119, 120, 135, 136, 137, 156, 157, 176, 177, 178, 280, 281, 282, 283 . . . superconducting shield coil; 90, 91, 109, 110 . . . superconducting correction coil; 148, 149, 167, 168 . . . permanent magnet; 52, 59, 77, 95, 114, 130, 150, 151, 169, 170, 277, 5, 25, 41, 60, 78, 96, 115, 131, 152, 171, 278 . . . low temperature enclosure; 6, 26, 42, 61, 79, 97, 116, 132, 153, 164, 172, 173, 279 . . . vacuum chamber; 7, 8, 27, 28, 43, 44, 62, 63, 80, 117, 118, 133, 134, 154, 155, 174, 175 . . . connecting tube; 11, 32, 55, 67, 84, 101, 121, 138, 158, 179, 226, 252, 266, 284, 297, 317 . . . magnet center axis or z-axis; 12, 33, 47, 68, 85, 102, 122, 139, 159, 180, 227, 253, 267, 285, 298, 318 . . . magnet center or origin; 13, 15, 34, 36, 38, 48, 50, 69, 71, 73, 86, 88, 103, 105, 107, 123, 125, 140, 142, 144, 160, 162, 181, 183, 185, 228, 230, 232, 254, 256, 268, 270, 272, 286, 288, 299, 301, 303, 319, 321, 323 . . . half line extending from the magnet center or origin to the cross section geometric center of the shield coil; 14, 16, 35, 37, 39, 49, 51, 70, 72, 74, 87, 89, 104, 106, 108, 124, 126, 141, 143, 145, 161, 163, 182, 184, 186, 229, 231, 233, 255, 257, 269, 21, 273, 287, 289, 300, 302, 304, 320, 322, 324 . . . angle between magnet center axis or z-axis and half line extending from the magnet center or origin to the cross section geometric center of the shield coil; 187, 188, 189, 190, 191, 198, 199, 200, 201, 202, 211, 212, 213, 214, 215, 242, 243, 246, 247, 258, 259 . . . main coil; 203, 216, 217, 218, 244, 245, 248, 249, 250, 251, 260, 261, 262, 263, 264, 265, 294, 295, 296, 307, 308, 309, 310, 311, 312, 313 . . . shield coil; 192, 204, 219 . . . 1000 gauss contour of the leakage magnetic field; 193, 205, 220 . . . 500 gauss contour of the leakage magnetic field; 194, 206, 221 . . . 100 gauss contour of the leakage magnetic field; 195, 207, 222 . . . 50 gauss contour of the leakage magnetic field; 196,208, 223 . . . 10 gauss contour of the leakage magnetic field; 197, 209, 224 . . . 5 gauss contour of the leakage magnetic field; 210, 225 . . . 1 gauss contour of the leakage magnetic field; 234 . . . internal area; 235 . . . external area; 236 . . . coil; 237 . . . magnetic material; 238 . . . space distribution in the external area of the first order component of the leakage magnetic field; 239 . . . space distribution in the external area of the third order component of the leakage magnetic field; 240 . . . space distribution in the external area of the fifth order component of the leakage magnetic field; 241 . . . space distribution in the external area of the seventh order component of the leakage magnetic field; 290, 291, 314, 315, 316 . . . the cross section geometric center of one or more shield coils making up the shield coil group; 292,305 . . . MRI magnet; 293,306 . . . MRI scan room.

INDUSTRIAL APPLICABILITY OF THE INVENTION

The present invention provides a superconducting magnet device and leakage magnetic field shield assembly for an open-type MRI apparatus, which are lightweight and have an extremely low leakage magnetic field, and a MRI apparatus using them.

What is claimed is:

1. A magnet device comprising two magnetostatic field-generating sources opposed across a finite region for generating a magnetic field in a first direction in said finite region,
  at least one of said generating sources including at least two shield current carrying means in almost concentric relation,
  said magnet device defining:
  a first axis being parallel to said first direction and passing through the almost center of said shield current carrying means;
  a second axis intersecting at right angles with said first axis and being spaced at an almost equal distance from said two magnetostatic field-generating sources;
  a first point where said first axis and second axis intersect,
  a first plane including said first axis, second axis, and first point; and
  an angle θn for the n-th shield current carrying means, said angle θn being in said first plane between said first axis and a half line extending from said first point to the cross section geometric center of said n-th shield current carrying means,
  wherein, said shield current carrying means in one or two of said magnetostatic field-generating sources have alternately positive and negative current carrying directions with increasing value of said θn.

2. A magnet device comprising two magnetostatic field-generating sources opposed across a finite region for generating a magnetic field in a first direction in said finite region,
  each of said generating sources including at least one of magnetic field generation current carrying means for generating said magnetic field,
  at least one of said generating sources including at least two shield current carrying means in almost concentric relation,
  said magnet device defining:
  a first axis being parallel to said first direction and passing through the almost center of said shield current carrying means;
  a second axis intersecting at right angles with said first axis and being spaced at an almost equal distance from said two magnetostatic field-generating sources;
  a first point where said first axis and second axis intersect,
  a first plane including said first axis, second axis, and first point; and
  an angle θn for the n-th shield current carrying means, said angle θn being in said first plane between said first axis and a half line extending from said first point to the cross section geometric center of said n-th shield current carrying means,
  wherein, said shield current carrying means in one or two of said magnetostatic field-generating sources have alternately positive and negative current carrying directions with increasing value of said θn.

3. A magnet device comprising two magnetostatic field-generating sources opposed across a finite region for generating a magnetic field in a first direction in said finite region,
  each of said generating sources including at least one of magnetic field generation current carrying means for generating said magnetic field and a ferromagnet for making the magnetic field uniform in said finite area,
  at least one of said generating sources including at least two shield current carrying means in almost concentric relation,
  said magnet device defining:
  a first axis being parallel to said first direction and passing through the almost center of said shield current carrying means;
  a second axis intersecting at right angles with said first axis and being spaced at an almost equal distance from said two magnetostatic field-generating sources;
  a first point where said first axis and second axis intersect;
  a first plane including said first axis, second axis, and first point; and an angle θn for the n-th shield current carrying means, said angle θn being in said first plane between said first axis and a half line extending from said first point to the cross section geometric center of said n-th shield current carrying means, wherein, said shield current carrying means in one or two of said magnetostatic field-generating sources have alternately positive and negative current carrying directions with increasing value of said θn.

4. A magnet device comprising two magnetostatic field-generating sources opposed across a finite region for generating a magnetic field in a first direction in said finite region, each of said generating sources including at least one of magnetic field generation current carrying means for generating said magnetic field, a ferromagnet for making the magnetic field uniform in said finite area, and at least one of correction current carrying means for making the magnetic field uniform, at least one of said generating sources including at least two shield current carrying means in almost concentric relation, said magnet device defining:

a first axis being parallel to said first direction and passing through the almost center of said shield current carrying means;

a second axis intersecting at right angles with said first axis and being spaced at an almost equal distance from said two magnetostatic field-generating sources;

a first point where said first axis and second axis intersect;

a first plane including said first axis, second axis, and first point; and an angle θn for the n-th shield current carrying means, said angle θn being in said first plane between said first axis and a half line extending from said first point to the cross section geometric center of said n-th shield current carrying means, wherein, said shield current carrying means in one or two of said magnetostatic field-generating sources have alternately positive and negative current carrying directions with increasing value of said θn.

5. A magnet device comprising two magnetostatic field-generating sources opposed across a finite region for generating a magnetic field in a first direction in said finite region, each of said generating sources including a permanent magnet, at least one of said generating sources including at least two shield current carrying means in almost concentric relation, said magnet device defining:

a first axis being parallel to said first direction and passing through the almost center of said shield current carrying means;

a second axis intersecting at right angles with said first axis and being spaced at an almost equal distance from said two magnetostatic field-generating sources;

a first point where said first axis and second axis intersect, a first plane including said first axis, second axis, and first point; and an angle θn for the n-th shield current carrying means, said angle θn being in said first plane between said first axis and a half line extending from said first point to the cross section geometric center of said n-th shield current carrying means, wherein, said shield current carrying means in one or two of said magnetostatic field-generating sources have alternately positive and negative current carrying directions with increasing value of said θn.

6. A magnet device comprising two magnetostatic field-generating sources opposed across a finite region for generating a magnetic field in a first direction in said finite region, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction and being in almost concentric relation, said magnet device defining:

a first axis being parallel to said first direction and passing through the almost center of said shield current carrying means;

a second axis intersecting at right angles with said first axis and being spaced at an almost equal distance from said two magnetostatic field-generating sources;

a first point where said first axis and second axis intersect;

a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein, said groups of said shield current carrying means in one or two of said magnetostatic field-generating sources have alternately positive and negative current carrying directions with increasing value of said θn.

7. A magnet device comprising two magnetostatic field-generating sources opposed across a finite region for generating a magnetic field in a first direction in said finite region, each of said generating sources including at least one of magnetic field generation current carrying means for generating said magnetic field, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction and being in almost concentric relation, said magnet device defining:

a first axis being parallel to said first direction and passing through the almost center of said shield current carrying means;

a second axis intersecting at right angles with said first axis and being spaced at an almost equal distance from said two magnetostatic field-generating sources;

a first point where said first axis and second axis intersect;

a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein, said groups of said shield current carrying means in one or two of said magnetostatic field-generating sources have alternately positive and negative current carrying directions with increasing value of said θn.

8. A magnet device comprising two magnetostatic field-generating sources opposed across a finite region for generating a magnetic field in a first direction in said finite region, each of said generating sources including at least one of magnetic field generation current carrying means for generating said magnetic field and a ferromagnet for making the magnetic field uniform in said finite area, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction and being in almost concentric relation, said magnet device defining:

a first axis being parallel to said first direction and passing through the almost center of said shield current carrying means;

a second axis intersecting at right angles with said first axis and being spaced at an almost equal distance from said two magnetostatic field-generating sources;

a first point where said first axis and second axis intersect;

a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein, said groups of said shield current carrying means in one or two of said magnetostatic field-generating sources have alternately positive and negative current carrying directions with increasing value of said θn.

9. A magnet device comprising two magnetostatic field-generating sources opposed across a finite region for generating a magnetic field in a first direction in said finite region, each of said generating sources including at least one of magnetic field generation current carrying means for generating said magnetic field, a ferromagnet for making the magnetic field uniform in said finite area, and at least one of correction current carrying means for making the magnetic field uniform, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction and being in almost concentric relation, said magnet device defining:

a first axis being parallel to said first direction and passing through the almost center of said shield current carrying means;

a second axis intersecting at right angles with said first axis and being spaced at an almost equal distance from said two magnetostatic field-generating sources;

a first point where said first axis and second axis intersect;

a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein, said groups of said shield current carrying means in one or two of said magnetostatic field-generating sources have alternately positive and negative current carrying directions with increasing value of said θn.

10. A magnet device comprising two magnetostatic field-generating sources opposed across a finite region for generating a magnetic field in a first direction in said finite region, each of said generating sources including a permanent magnet, at least one of said generating sources including at least two groups of shield current carrying means, each group consisting of at least one shield current carrying means, at least one group of said shield current carrying means including at least two shield current carrying means, said shield current carrying means making up each group of said shield current carrying means having the same shield current carrying direction being in almost concentric relation, said magnet device defining:

a first axis being parallel to said first direction and passing through the almost center of said shield current carrying means;

a second axis intersecting at right angles with said first axis and being spaced at an almost equal distance from said two magnetostatic field-generating sources;

a first point where said first axis and second axis intersect;

a first plane including said first axis, second axis, and first point; and an angle θn for the n-th group of said shield current carrying means, said angle θn being in said first plane between said first axis and a half line extending from said first point to the cross section geometric center of all the shield current carrying means making up said n-th group of said shield current carrying means, wherein, said groups of said shield current carrying means in one or two of said magnetostatic field-generating sources have alternately positive and negative current carrying directions with increasing value of said θn.

11. The magnet device of claim 1, wherein the shield current carrying means with the largest average radius of said shield current carrying means has a larger magnetomotive force in absolute value than each of the other shield current carrying means.

12. The magnet device of claim 6, wherein said shield current carrying means making up the group of said shield current carrying means including the shield current carrying means with the largest average radius has a larger magnetomotive force in absolute value than said shield current carrying means making up the other group of said shield current carrying means.

13. The magnet device of claim 1, wherein said magnet device has a ferromagnet forming a magnetic path by connecting magnetically to said two magnetostatic field-generating sources.

14. The magnet device of claim 1, wherein said magnetic field generation current carrying means is formed of superconducting materials, and said two magnetostatic field-generating sources have a cooling means for cooling and keeping said magnetic field generation current carrying means at superconducting temperatures.

15. The magnet device of claim 1, wherein said shield current carrying means is formed of superconducting materials, and said two magnetostatic field-generating sources have a cooling means for cooling and keeping said shield current carrying means at superconducting temperatures.

16. The magnet device of claim 1, wherein said shield current carrying means, said magnetic field generation current carrying means, and said correction current carrying means for making the magnetic field uniform are coil units.

17. The magnet device of claim 1, wherein said magnetic field in said region is almost uniform.

18. An MRI apparatus using the magnet device of claim 1.

19. A magnet device and shield current carrying means assembly comprising:
a magnet device for generating a magnetic field in a first direction in a finite region; and
at least two shield current carrying means almost concentric with a first axis being almost parallel to said first direction and passing through the almost center of said magnet device,
said magnet device and shield current carrying means assembly defining:
a first point on said first axis at said almost center of said magnet device;
a first plane including said first axis and first point;
a second plane including said first point and intersecting at almost right angles with said first axis; and
an angle θn for the n-th shield current carrying means, said angle θn being in said first plane between said first axis and a half line extending from said first point to the cross section geometric center of said n-th shield current carrying means,
wherein
said shield current carrying means in at least one of the two spaces separated by said second plane has alternately positive and negative current carrying directions with increasing value of said θn.

20. The magnet device and shield current carrying means assembly of claim 19, wherein said shield current carrying means is a coil unit.

21. The magnet device and shield current carrying means assembly of claim 19, wherein said magnetic field in said region is almost uniform.

22. A magnet device and shield current carrying means group assembly comprising:

a magnet device for generating a magnetic field in a first direction in a finite region; and
at least two groups of shield current carrying means almost concentric with a first axis being almost parallel to said first direction and passing through the almost center of said magnet device, each group consisting of at least one shield current carrying means,
at least one group of said shield current carrying means including at least two shield current carrying means,
said shield current carrying means making up each group of said shield current carrying means having the same shield current carrying direction,
said assembly including:
a first point on said first axis at said almost center of said magnet device;
a first plane including said first axis;
a second plane including said first point and intersecting at almost right angles with said first axis; and
an angle θn for the n-th group of said shield current carrying means, said angle θn being in said first plane between said first axis and a half line extending from said first point to the cross section geometric center of all the shield current carrying means making up said n-th group of said shield current carrying means,
wherein said groups of said shield current carrying means in at least one of the two spaces separated by said second plane has alternately positive and negative current carrying directions with increasing value of said θn.

23. The magnet device and shield current carrying means group assembly of claim 22, wherein said shield current carrying means is a coil unit.

24. The magnet device and shield current carrying means group assembly of claim 22, wherein said magnetic field in said region is almost uniform.

25. A shield current carrying means assembly for controlling or reducing the magnetic field leakage of a magnet device for generating a magnetic field in a first direction in a finite region, comprising at least two shield current carrying means almost concentric with a first axis being almost parallel to said first direction and passing through the almost center of said magnet device,
said assembly defining:
a first point on said first axis at said almost center of said magnet device;
a first plane including said first axis and first point;
a second plane including said first point and intersecting at almost right angles with said first axis; and
an angle θn for the n-th shield current carrying means, said angle θn being in said first plane between said first axis and a half line extending from said first point to the cross section geometric center of said n-th shield current carrying means,
wherein said shield current carrying means in at least one of the two spaces separated by said second plane has alternately positive and negative current carrying directions with increasing value of said θn.

26. The shield current carrying means assembly of claim 25, wherein said shield current carrying means assembly is a coil unit.

27. A shield current carrying means group assembly for controlling or reducing the magnetic field leakage of a magnet device for generating a magnetic field in a first direction in a finite region, comprising at least two groups of shield current carrying means almost concentric with a first axis being almost parallel to said first direction and passing through the almost center of said magnet device, each group consisting of at least one shield current carrying means, at least one group of said shield current carrying means including at least two shield current carrying means, said shield current carrying means making up each group of said shield current carrying means having the same shield current carrying direction, said assembly including:

a first point on said first axis at said almost center of said magnet device;

a first plane including said first axis and first point;

a second plane including said first point and intersecting at almost right angles with said first axis; and an angle $\theta n$ for the n-th group of said shield current carrying means, said angle $\theta n$ being in said first plane between said first axis and a half line extending from said first point to the cross section geometric center of all the shield current carrying means making up said n-th group of said shield current carrying means, wherein said groups of said shield current carrying means in at least one of the two spaces separated by said second plane has alternately positive and negative current carrying directions with increasing value of said $\theta n$.

28. The shield current carrying means group assembly of claim 27, wherein said shield current carrying means is a coil unit.

29. An MRI apparatus using the magnet device and shield current carrying means assembly of claim 19.

30. An MRI apparatus using the magnet device and shield current carrying means group assembly of claim 22.

31. An MRI apparatus using the shield current carrying means assembly of claim 25.

32. An MRI apparatus using the shield current carrying means group assembly of claim 27.

33. A magnet device comprising a magnetostatic field-generating source for generating a magnetic field in a first direction in a finite region, said magnetostatic field-generating source comprising at least two shield current carrying means in almost concentric relation, said magnet device defining:

a first axis being parallel to said first direction and passing through the almost center of said shield current carrying means;

a second axis intersecting at right angles with said first axis and passing through the almost center of said magnetostatic field-generating source;

a first point where said first axis and second axis intersect;

a first plane including said first axis, second axis, and first point;

a second plane including said first point and intersecting at almost right angles with said first axis; and an angle $\theta n$ for the n-th shield current carrying means, said angle $\theta n$ being in said first plane between said first axis and a half line extending from said first point to the cross section geometric center of said n-th shield current carrying means, wherein, said shield current carrying means in at least one of the two spaces separated by said second plane has alternately positive and negative current carrying directions with increasing value of said $\theta n$.

34. A magnet device comprising a magnetostatic field-generating source for generating a magnetic field in a first direction in a finite region, said magnetostatic field-generating source comprising at least two groups of shield current carrying means, each group consisting of at least one shield current carrying means, at least one group of said shield current carrying means including at least two shield current carrying means, said shield current carrying means making up each group of said shield current carrying means having the same shield current carrying direction and being in almost concentric relation, said magnet device defining:

a first axis being parallel to said first direction and passing through the almost center of said shield current carrying means;

a second axis intersecting at right angles with said first axis and passing through the almost center of said magnetostatic field-generating source;

a first point where said first axis and second axis intersect;

a first plane including said first axis, second axis, and first point;

a second plane including said first point and intersecting at almost right angles with said first axis; and an angle $\theta n$ for the n-th group of said shield current carrying means, said angle $\theta n$ being in said first plane between said first axis and a half line extending from said first point to the cross section geometric center of all the shield current carrying means making up said n-th group of said shield current carrying means, wherein, said groups of said shield current carrying means in at least one of the two spaces separated by said second plane has alternately positive and negative current carrying directions with increasing value of said $\theta n$.

35. The magnet device of claim 33, wherein said magnetic field in said region is almost uniform.

36. The magnet device of 33, wherein said shield current carrying means is a coil unit.

37. An MRI apparatus using the magnet device of 33.

38. A magnet device comprising one or more magnetostatic field-generating sources almost concentric with a center axis, said magnet device defining:

a sphere centered at the center of said one or more magnetostatic field-generating sources and circumscribed about said magnet device; and a semicircle centered at said center with both ends of said semicircle on said center axis and with a radius from 1.1 to 1.5 times the radius of said sphere, wherein a magnetic field vector on said semicircle has a radial component having alternately opposite directions along the arc from one end to another of said semicircle and having more than five adjacent regions with different direction, and/or a tangential component having alternately opposite directions along the arc from one end to another of said semicircle and having more than four adjacent regions with different directions.

39. A magnet device comprising one or more magnetostatic field-generating sources almost concentric with the center axis, said magnet device defining:

a sphere centered at the center of said one or more magnetostatic field-generating sources and circumscribed about said magnet device;

a semicircle centered at said center with both ends of said semicircle on said center axis and with a radius from 1.1 to 1.5 times the radius of said sphere; and one-forth-circular-arc from said semicircle arc divided by a plane orthogonal to said center axis and including said center, wherein a magnetic field vector on said one-forth-circular-arc has a radial component having alternately opposite directions along said arc from one end to another of said arc and having more than three adjacent regions with different directions, and/or a tangential component having alternately opposite directions along said arc from one end to another of said arc and having more than three adjacent regions with different directions.

40. The magnet device of claim 38, wherein said magnetostatic field-generating sources consist of two opposed magnetostatic field-generating source assemblies.

41. The magnet device of claim 38, wherein said magnetostatic field-generating sources include a permanent magnet.

42. The magnet device of claims 38, wherein said magnetostatic field-generating sources include a coil.

43. The magnet device of claim 38, wherein said magnetostatic field-generating sources include a coil wound on a cylindrical bobbin.

44. The magnet device of claim 38, wherein said magnet device includes a shield coils for carrying currents for shielding the leakage magnetic field.

45. The magnet device of claim 42, wherein said coil or shield coil is formed of superconducting materials, and said magnet device has a cooling means for cooling and keeping said coil or shield coil at superconducting temperatures.

46. An MRI apparatus using the magnet device of claims 38.

* * * * *